(12) United States Patent
Yagi

(10) Patent No.: US 8,063,405 B2
(45) Date of Patent: Nov. 22, 2011

(54) DISPLAY DEVICE AND MANUFACTURING METHOD THEREOF, AND SEMICONDUCTOR DEVICE AND MANUFACTURING METHOD THEREOF

(75) Inventor: Iwao Yagi, Kanagawa (JP)

(73) Assignee: Sony Corporation, Tokyo (JP)

( * ) Notice: Subject to any disclaimer, the term of this patent is extended or adjusted under 35 U.S.C. 154(b) by 150 days.

(21) Appl. No.: 12/485,582

(22) Filed: Jun. 16, 2009

(65) Prior Publication Data

US 2009/0309103 A1 Dec. 17, 2009

(30) Foreign Application Priority Data

Jun. 17, 2008 (JP) ................................. 2008-157489

(51) Int. Cl.
*H01L 29/04* (2006.01)
*H01L 29/15* (2006.01)
*H01L 31/036* (2006.01)
*H01L 35/24* (2006.01)
*H01L 51/00* (2006.01)
*H01L 21/336* (2006.01)
*H01L 29/786* (2006.01)

(52) U.S. Cl. ....... 257/72; 257/69; 257/40; 257/E21.414; 257/E29.294

(58) Field of Classification Search .................... 257/72, 257/69, 40, E21.414, E29, 294
See application file for complete search history.

(56) References Cited

U.S. PATENT DOCUMENTS

| | | | |
|---|---|---|---|
| 6,300,988 B1 | 10/2001 | Ishihara | |
| 6,613,614 B2 * | 9/2003 | Yamazaki et al. | ............ 438/151 |
| 6,683,666 B1 | 1/2004 | Jang | |
| 6,774,969 B2 * | 8/2004 | Ma et al. | ........................ 349/139 |
| 7,015,502 B2 * | 3/2006 | Arai et al. | ........................ 257/40 |
| 7,223,641 B2 * | 5/2007 | Maekawa | ........................ 438/149 |
| 7,332,432 B2 * | 2/2008 | Nakamura et al. | ............ 438/677 |
| 7,470,604 B2 * | 12/2008 | Fujii | ............................. 438/538 |
| 7,674,650 B2 * | 3/2010 | Akimoto et al. | ............... 438/104 |
| 7,738,055 B2 * | 6/2010 | Egi et al. | ......................... 349/96 |
| 7,767,595 B2 * | 8/2010 | Tanaka et al. | .................. 438/795 |
| 2005/0163938 A1 * | 7/2005 | Yamazaki et al. | ............ 427/554 |

FOREIGN PATENT DOCUMENTS

| | | |
|---|---|---|
| JP | 2000-269504 | 9/2000 |
| JP | 2002-269504 | 9/2002 |
| JP | 2007-036259 | 2/2007 |
| WO | WO2007148601 | 12/2007 |

OTHER PUBLICATIONS

Japanese Patent Office Action corresponding to Japanese Serial No. 2008-157489 dated Apr. 20, 2010. European Search Report corresponding to European Serial No. 09007890.8 dated Sep. 11, 2009.
DeVusser, S. ; "Integrated Shadow Mask Method for Patterning Small Molecule Organic Semiconductors"; Applied Physics Letters, AIPR American Institute of Physics; vol. 88, No. 10; dated Mar. 7, 2006.

* cited by examiner

*Primary Examiner* — Luan C Thai
(74) *Attorney, Agent, or Firm* — SNR Denton US LLP

(57) ABSTRACT

A display device includes source/drain electrodes on a substrate, a pixel electrode, an insulating partition wall layer, a channel-region semiconductor layer. The source/drain electrodes and the pixel electrode are formed on the substrate and in contact with each other. The insulating partition wall layer is formed on the substrate and provided with a first opening extending to between the source electrode and the drain electrode and a second opening formed on the pixel electrode and extending to the pixel electrode. The channel-region semiconductor layer is formed on the bottom of the first opening. The insulating film is formed on the partition wall layer so as to cover the first opening including the channel-region semiconductor layer. The oriented film covers the first opening from above the insulating film and the second opening from the pixel electrode.

11 Claims, 14 Drawing Sheets

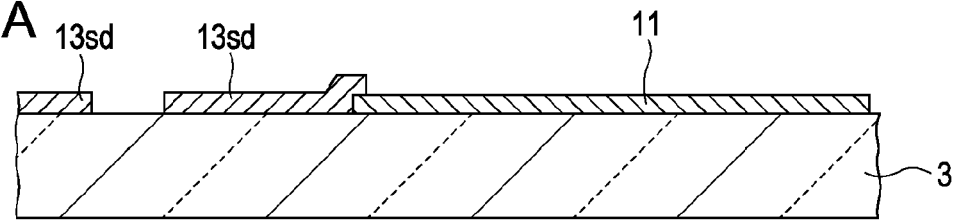
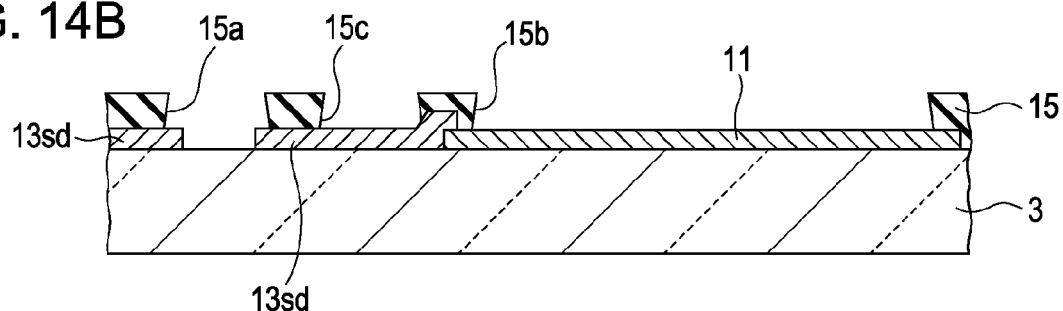
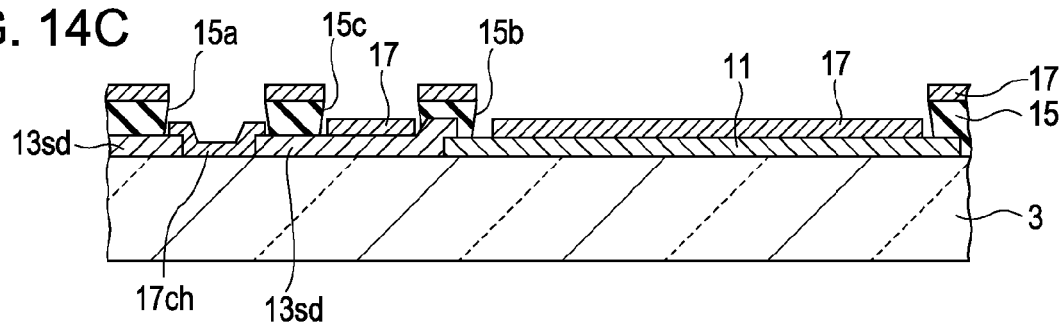
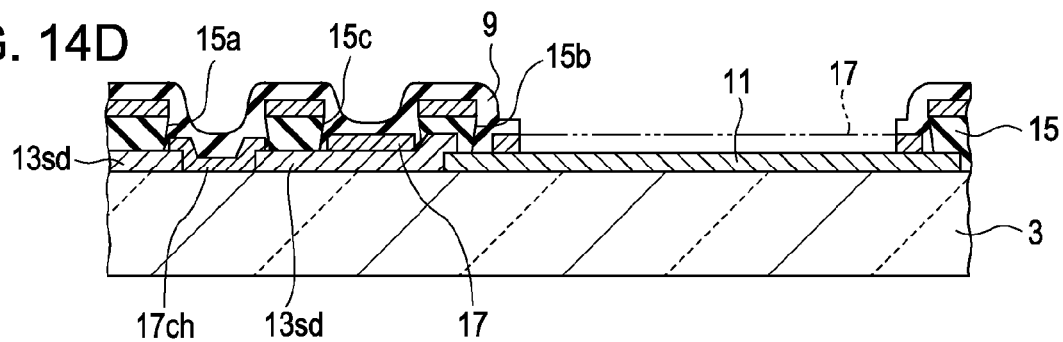
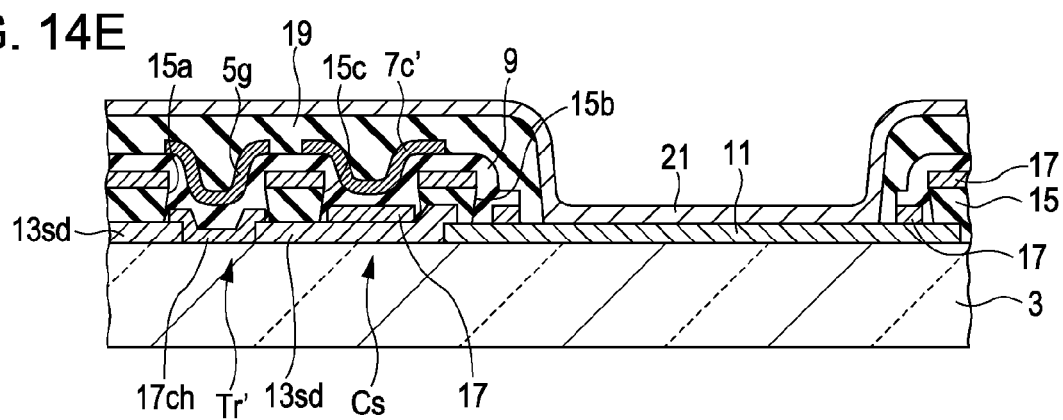

DISPLAY DEVICE AND MANUFACTURING METHOD THEREOF, AND SEMICONDUCTOR DEVICE AND MANUFACTURING METHOD THEREOF

BACKGROUND OF THE INVENTION

1. Field of the Invention

The present invention relates to a semiconductor device having a semiconductor layer made of a finely patterned thin film, a method of manufacturing such a semiconductor device, a display device using such a semiconductor device, and a method of manufacturing such a display device.

2. Description of the Related Art

Thin-film transistors (TFTs) are widely used as pixel transistors in electronic circuits, in particular, in active-matrix-driven flat display units. Recently, the use of an organic material as a semiconductor layer used for such a semiconductor device having a small thickness has attracted attention. In the case of the semiconductor device using the organic material as the semiconductor layer, such a layer can be formed at a temperature lower than that of a semiconductor device using an inorganic material as a semiconductor layer. Therefore, such organic thin-film transistors are advantageous in that thin-film transistors having a large area can be produced, and organic thin-film transistors can be formed on a flexible substrate having poor heat resistance, such as a plastic substrate. Organic thin-film transistors are promising from the viewpoint of realization of multifunctional devices and reduction in cost.

For patterning the semiconductor layer made of the organic material, a vacuum deposition process using a printing method, a metal mask, or the like is carried out. In addition to this, other processes are also performed, including a process of selectively removing an organic semiconductor layer portion on the upper side of a resist pattern by a lift-off technique after the formation of an organic material layer from above the resist pattern and a process of pattern-etching a semiconductor layer using a resist pattern as a mask.

However, the vacuum deposition process using the printing method, the mask, or the like has a disadvantage of limited pattern definition. Particularly, in the case of the vapor deposition process using the metal mask, it is difficult to form a pattern on a large-area substrate with good positional accuracy. Furthermore, in the case of the process using the resist pattern, a resist removal solution used for the removal of a resist pattern also damages an organic semiconductor layer and causes problems of an increase in leak current, a decrease in electron mobility, and a change in threshold voltage in the organic semiconductor layer.

Therefore, another process of forming a semiconductor layer has been proposed. This process includes the steps of: forming a partition wall layer (patterned insulating layer) with large steps on a substrate on which a semiconductor layer is to be formed; and depositing the semiconductor layer from above the partition wall layer. Thus, the semiconductor layer is patterned as one constructed of two parts, a lower part and an upper part, which are divided by the above steps. In other words, for example, source/drain electrodes are pattern-formed on a gate insulating film that covers a gate electrode and the partition wall layer is then formed on the source/drain electrodes. Subsequently, a semiconductor layer is deposited from above the partition wall layer. Part of the semiconductor is placed on the upper part of the partition-wall layer. On the other hand, the rest of the semiconductor is divided from such a part and provided as a semiconductor layer that serves as a channel region between the source/drain electrodes under the partition wall layer (see Japanese Unexamined Patent Application Publication No. 2000-269504A, particularly, FIG. 1 and FIG. 6 and the related descriptions thereof; and Stijn De Vusser, et al., "Integrated shadow mask method for patterning small molecule organic semiconductor" (Applied Physics Letters 88, 2006 American Institute of physics, 2006, 103501-1 to 103501-3).

Furthermore, in the case of a liquid display device using a thin-film transistor with the above semiconductor layer as a pixel transistor, pixel electrodes are formed as parts of the same layer as that of source/drain electrodes or as parts of a layer different therefrom on a gate electrode while being connected to the source/drain electrode. After that, in a manner similar to one described above, a partition wall layer is formed on the source/drain electrodes and the pixel electrode and a semiconductor layer is then formed as a channel region between source/drain electrodes. Subsequently, an oriented film is formed from above these layers via an insulating protective film so that the layers can be covered with the oriented film (see Japanese Unexamined Patent Application Publication No. 2000-269504A, particularly, FIG. 1 and FIG. 6).

SUMMARY OF THE INVENTION

However, in the liquid crystal display device disclosed in Japanese Unexamined Patent Application Publication No. 2000-269504A, the partition wall layer and the semiconductor layer are stacked on the pixel electrode as described above. Therefore, display light is displayed after passing through the semiconductor layer and the partition wall layer. It means that transmitted light is colored by the presence of the semiconductor layer and the partition wall layer and affects the color quality of an image.

In addition, even if the pixel electrodes connected to the thin-film transistors extend outside of the protective film, it is difficult to ensure the insulation between the pixel electrodes because of the presence of the overall semiconductor layer under the protective film.

Therefore, it is desirable to provide a display device having good image quality and a method of manufacturing such a display device, where the display device includes a semiconductor layer prepared by deposition from above a partition wall layer and finely patterned, while allowing the pattern formation of a pixel electrode without an influence of the semiconductor layer. In addition, it is also desirable to provide a semiconductor device and a method of manufacturing such a semiconductor device, where the semiconductor device is suitably used as a drive substrate (i.e., a back board or so-called backplane) of such a display device.

In order to respond these requests, a display device according to an embodiment of the present invention includes the following components. That is, a source electrode and a drain electrode are formed on a substrate. A pixel electrode is formed on the substrate and in contact with the source electrode or the drain electrode. An insulating partition wall layer is formed on the substrate and having a first opening extending to between the source electrode and the drain electrode and a second opening formed on the pixel electrode and extending to the pixel electrode. Also, a channel-region semiconductor layer is formed on the bottom of the first opening. An insulating film is formed on the partition wall layer so as to cover the first opening including the channel-region semiconductor layer. Furthermore, an oriented film covering the first opening from the insulating film and covering the second opening from the pixel electrode.

In order words, the display device includes a thin-film transistor and pixel electrodes connected to the thin-film transistors, which are formed and arranged on a substrate. In addition, an insulating partition wall layer is formed on such a substrate on which the source/drain electrodes of the thin-film transistor and the pixel electrodes are formed. The partition wall layer is provided with a first opening located at a position corresponding to the channel region of the thin-film transistor and a second opening where an area of forming the pixel electrode is exposed. The bottom of the first opening is provided with a channel-region semiconductor layer that constitutes an active layer of the thin-film transistor, while the semiconductor layer on the bottom of the second opening is removed therefrom.

Since the display device constructed as described above is provided with the channel-region semiconductor layer on the bottom of the first opening formed in the partition wall layer, such a channel-region semiconductor layer can be finely separated and patterned by deposition of a semiconductor layer from above the partition wall layer. Besides, in addition to the first opening, the partition wall layer is also provided with the second opening from which the area of forming the pixel electrode is exposed and the semiconductor layer in the second opening is removed therefrom. Therefore, light passing reflecting from the pixel electrode or light passing through the pixel electrode can be taken out without an influence of the semiconductor layer and the partition wall layer.

A method of manufacturing a display device according to another embodiment of the present invention includes the following steps. Source/drain electrodes of a thin-film transistor are formed on the substrate, while a pixel electrode is connected to the source/drain electrodes. An insulating partition wall layer is formed on the substrate, where the partition wall layer has a first opening extending to between the source electrode and the drain electrode and a second opening formed on the center of the pixel electrode and extending to the pixel electrode. Furthermore, a channel-region semiconductor layer is constructed of a semiconductor on the bottom of the first opening.

Furthermore, according to a further embodiment of the present invention, a semiconductor device suitably used as a drive substrate (back plate) of the display device as described above and a method of manufacturing such a semiconductor device are provided. In this embodiment, for example, a conductive pattern is formed as the above pixel electrode.

According to any of the embodiments of the present invention, the channel-region semiconductor layer is finely separated and patterned by deposition from above the partition wall layer. Thus, a pixel electrode free of any influence of the partition wall layer and the semiconductor layer remained on the top thereof can be obtained. In addition, it becomes possible to improve the image quality of the display device having the pixel electrode.

BRIEF DESCRIPTION OF THE DRAWINGS

FIG. 3 is a cross-sectional view illustrating a manufacturing method of the display device according to the first embodiment, where

FIG. 9 is a cross-sectional view illustrating a manufacturing method of the display device according to the fifth embodiment, where

FIG. 14 is a cross-sectional view illustrating a manufacturing method of the display device according to the eighth embodiment, where FIG. 14A to FIG. 14E illustrate the respective steps;

DESCRIPTION OF THE PREFERRED EMBODIMENTS

Hereinafter, embodiments of the present invention will be described in detail with reference to the attached drawings. In the following description, the embodiments of the present invention will be applied to active-matrix type liquid crystal display devices, but not limited thereto.

First Embodiment

Figure 1:
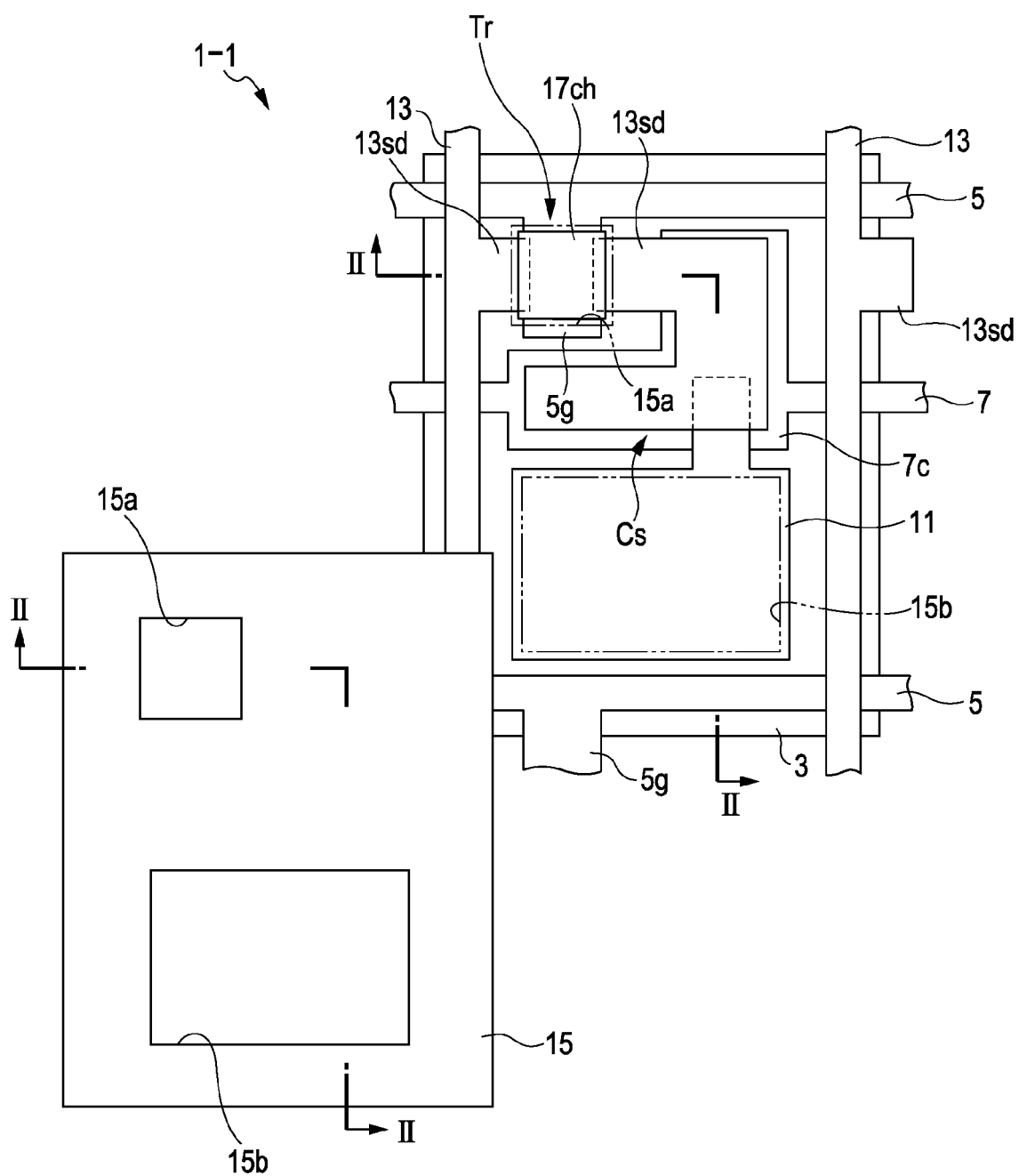
FIG. 1 is a schematic plan view of part of a drive-side substrate, which corresponds to one of pixels, of a display device using a bottom-gate type thin-film transistor according to any of first to fourth embodiments an eighth embodiment of the present invention.
Figure 2:
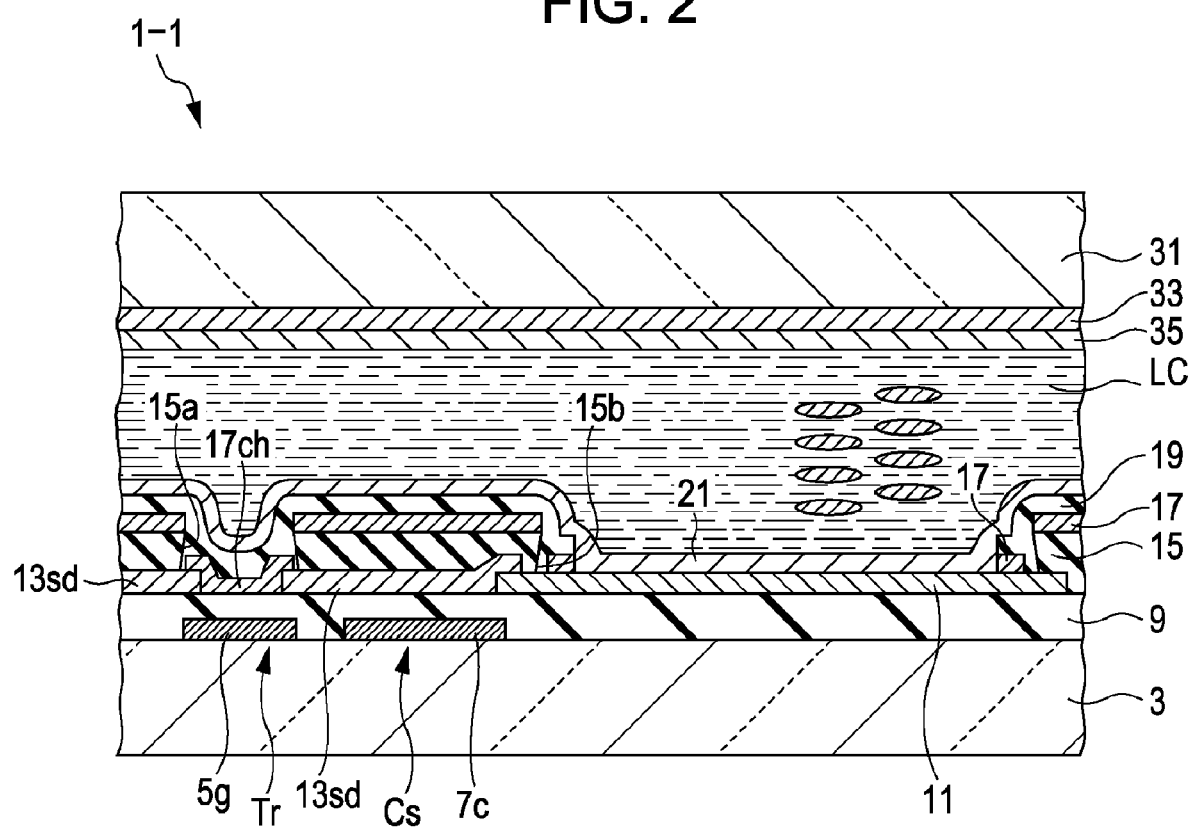
FIG. 2 is a cross-sectional view along the line II-II in FIG. 1 for illustrating a display device according to a first embodiment.

Referring to FIG. 1 and FIG. 2, a display device according to a first embodiment of the present invention will be described. FIG. 1 is a schematic plan view of part of a drive-side substrate, which corresponds to one of pixels, of a display device 101 according to the embodiment of the present invention. Here, a bottom-gate type thin-film transistor is used as a thin-film transistor Tr for pixel driving. Also, FIG. 2 is a cross-sectional view along the line II-II in FIG. 1.

In the display device 1-1 shown in the figures, the first layer on a substrate 3 having transparency to visible light (hereinafter, referred to as "optical transparency") includes scan lines 5 and common lines 7 which are arranged thereon in the horizontal direction. A gate electrode 5g of the thin-film transistor Tr is formed from each scan line 5 toward the common line 7 and extends in the vertical direction. In addition, an intermediate part of each common line 7 is patterned as a lower electrode 7c of a capacitative element Cs.

An optically transparent gate insulating film 9 (only shown in FIG. 2) is formed on the substrate 3, covering the scan lines 5 and the common lines 7.

The second layer on the substrate 3 is formed on the gate insulating film 9 and includes a transmissive display electrode 11 made of a transmissive conductive material, which is optically transparent, and is formed as a pixel electrode. Here, the transmissive display electrode 11 is formed on a wide area of each pixel.

In addition, a plurality of signal lines 13 (only shown in FIG. 1) is arranged on the gate insulating film 9, extending in a direction perpendicular to the scan lines 5 and the common lines 7. Pixels are provided at the intersections between the scan lines 5 and the signal lines 1. In each pixel, the transmissive display electrodes 11 are formed.

From each signal line 13, one source/drain electrode 13sd of the thin-film transistor Tr extends toward one side of the gate electrode 5g in the horizontal direction. The other source/drain electrode 13sd, which is located on the opposite side of the gate electrode 5g, also serves as an upper electrode of the capacitative element Cs and extends over the lower electrode 7c through the gate insulating film 9. Thus, these stacked portions constitute the capacitative element Cs. In addition, the end of the source/drain electrode, which also serves as the upper electrode of the capacitative element Cs, is superposed on the end of the transmissive display electrode 11 to directly connect therewith. More specifically, as shown in the figure, the end of the source/drain electrode 13sd may be placed on the end of the transmissive display electrode 11 or vice versa.

Furthermore, an insulating partition wall layer 15 is formed on the upper side of the substrate 3 on which the transmissive display electrodes 11, the signal lines 13, and the source/drain electrodes 13sd have been formed. The partition wall layer 15 has a first opening 15a at a position corresponding to a channel part of the thin-film transistor Tr or at a position on the gate electrode 5g between the source/drain electrodes 13sd. In addition to the first opening 15a, the partition wall layer 15 also has a wide second opening 15b above the transmissive display electrode 11. As long as the second opening 15b is separated from the first opening 15a, the second opening 15b may be of any size and shape even if it extends outside of the region corresponding to the transmissive display electrode 11.

Here, it is important that the partition wall layer 15 divides a semiconductor layer 17, which will be described later, into two parts respectively on the upper and lower parts of the partition wall layer 15. Such a partition wall layer 15 has a film thickness sufficiently larger than that of the semiconductor layer 17. In addition, the side walls of the first and second openings 15a, 15b are vertical or preferably inclined so that each of the openings narrows toward the upper side of the opening to form a reversely tapered opening.

As shown in the figure, such a partition wall layer 15 may have a reversely tapered side wall (in cross section) with a substantially uniform inclined angle. In the partition wall layer 15 constructed of stacked layers, the opening may widen as it approaches the lower film. Furthermore, in the case of separating the upper part and the lower part of the partition wall layer 15 from each other by disposing a semiconductor layer 17 therebetween described below, only the upper part of the partition wall layer 15 may be formed in a reversely tapered shape.

A channel-region semiconductor layer 17ch, which constitutes an active layer of the thin film transistor Tr, is formed on the bottom of the first opening 15a of the partition wall layer 17ch. In addition, the thin-film transistor Tr is constructed of the gate electrode 5g, the source/drain electrodes 13sd arranged on both sides of the gate electrode 5g through the gate insulating film 9, and the channel-region semiconductor 1 laminated on the gate electrode g while being in contact with the source/drain electrodes 13sd.

The channel-region semiconductor 17ch is a semiconductor layer 17 (only shown in FIG. 2) formed from the upper part of the partition wall layer 15 and patterned at the bottom of the first opening 15a while being separated from another part of the semiconductor layer 17 on the partition wall layer 15. In addition, the semiconductor layer 17 is not formed on or extensively removed from the transparent display electrode 11 on the bottom of the second opening 15b. Thus, the transparent display electrode 11 can be extensively exposed from the semiconductor layer 17.

On the substrate 3 on which the channel-region semiconductor layer 17ch, the partition wall layer 15, and the transmissive display electrode 11 are formed as described above, an oriented film 21 is further formed on the substrate 3 via the insulating film 19 (only shown in FIG. 2).

The insulating film 19 is preferably a protective film of the channel-region semiconductor layer 17ch, but the part thereof on the transmissive display electrode 11 is removed. However, when the insulating film 19 is made of a transparent material, the transmissive display electrode 11 may be also covered with the insulating film 19. In other words, the insulating film 19 is formed on the partition wall layer 15 and covers the first opening 15a including the channel-region semiconductor layer 17ch. The oriented film 21 is also formed so that it can serve as a protective film for covering the first opening 15a from the top of the insulating film 19 and covering the second opening 15b from the top of the transmissive display electrode 11.

Furthermore, in the above configuration of the display device, any of the layers stacked on the transmissive display electrode 11 and the substrate 3 may be one having good visible-light transmittance as much as possible.

On the other hand, an opposing substrate 31 (only shown in FIG. 2) is arranged facing one side of the driving substrate 3, were the transmissive display electrode 11 is formed as described above. The opposing substrate 31 is made of an optically transparent material and has an optically transparent common electrode 33 made of a transmissive conductive material, which is common to all pixels, while the oriented film 35 is formed in a state of covering such a common electrode 33. Furthermore, a liquid crystal layer LC and a spacer (not shown) are disposed between the oriented film 21 of the substrate 3 and the oriented film 35 of the opposing substrate 31. Furthermore, additional oriented plates (not shown) are arranged on the outside of the substrate 3 and the outside of the opposite substrate 31, respectively. As a result, a display device 1-1 is constructed.

In such a display device 1-1, light incident from the substrate 3 through the deflecting plate can penetrate the transmissive display electrode 11 and reach the liquid crystal layer LC. Then, only light, which is in a certain polarization state caused by passing through the liquid crystal layer LC oriented in a predetermined direction depending on the state of voltage application to both the transmissive display electrode and the common electrode 33, can pass through a polarization plate on the side of the opposing substrate 31 and can be taken out as display light.

Referring now to FIG. 3, a method of manufacturing the display device 1-1 constructed as described above will be described. FIGS. 3A to 3E are cross-sectional diagrams corresponding the respective steps of the method.

Figure 3A:
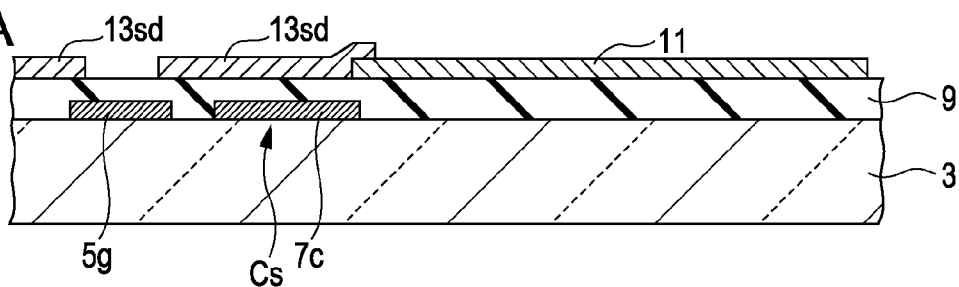
FIG. 3A to FIG. 3E illustrate the respective steps.

First, as shown in FIG. 3A, an optically transparent substrate 3 is prepared. The substrate 3 may be made of any material, such plastic or glass, but is not limited thereto. Alternatively, it may be a glass or plastic substrate covered with an insulating protective film, preferably one having a favorable visible light transmittance (80 to 90% or more). Furthermore, when the display device to be manufactured here is a flexible display, it is preferable to a plastic substrate.

First layer components, a gate electrode 5g and a lower electrode 7c, are formed on the substrate 3 together with the formation of wiring lines, a scanning line and a common layer (not shown). The formation of these electrodes and wiring lines can be performed without depending on any particular technology and any particular material. Any of technologies and materials can be applied thereto. For example, lithography may be preferably employed to form electrodes and wiring lines more finely. In this case, a formed electrode material layer is subjected to taper-pattern etching using a resist pattern formed by lithography as a mask. Examples of the electrode material layer include an aluminum (Al) film, a gold (Au) film, a stacked film including a gold (Au) film and a chromium (Cr) film, a silver (Ag) film, a palladium (Pd) film, and a stacked film of these films.

Next, an optically transparent gate insulating film 9 is formed on the substrate 3 while covering the gate electrode 5g, the lower electrode 7c, and so on. The gate insulating film 9 can be formed using any technology and materials. For example, the gate insulating film 9 is made of an inorganic material, such as silicon oxide or silicon nitride, or an organic material, such as polyvinylphenol or polymethylmethacrylate (PMMA), but is not limited thereto.

Next, the pattern of a transmissive display electrode 11 with optical transparency made of a transmissive conductive material is formed as part of the second layer on the gate insulating film 9. Such a transmissive display electrode 11 can be formed using any technology and materials. Examples of the transmissive conductive material include thin films of oxides, such as indium tin oxide (ITO) and indium zinc oxide (IZO). Alternatively, any of organic substances, such as PEDOT: poly(3,4-ethylene dioxythiophene) and PSS: poly(4-styrene sulfonate) may be used. However, when using such organic substances, it is preferable that the upper surface of the organic substance is covered with a thin inorganic substance (partition wall layer) because of preventing the organic substance from being damaged in the subsequent etching step.

After that, source/drain electrodes 13sd and wiring lines (not shown) are formed as parts of the second layer on the gate insulating film 9. These electrodes and wiring lines can be formed using any technology and materials. For example, they may be formed in a manner similar to the formation of the gate electrode 5g and the lower electrode 7c which reside in the first layer. Therefore, a capacitive element Cs constructed of the gate insulating film 9 placed between the lower electrode 7c and one of the source/drain electrodes 13sd.

Figure 3B:
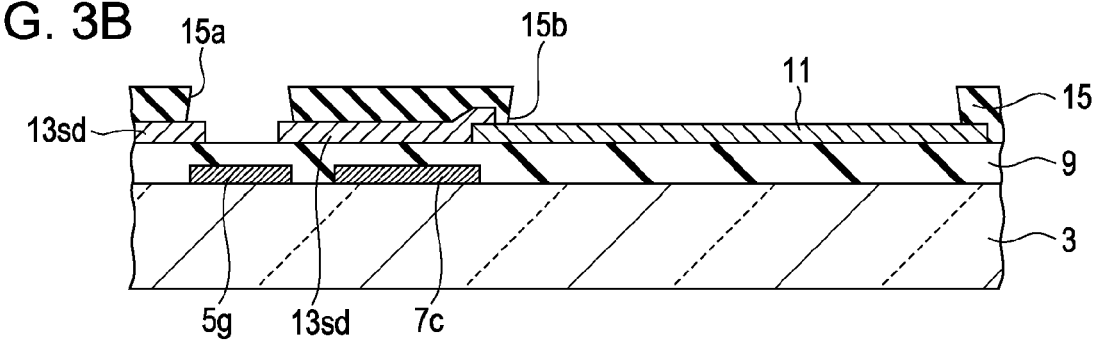

Next, as shown in FIG. 3B, a partition wall layer 15 having a first opening 15a and a second opening 15b on the gate insulting film 9 on which the transmissive display electrode 11 and the source/drain electrodes 13sd are formed. Each of these openings 15a and 15b has a reversely tapered wall. Furthermore, the openings 15a and 15b are formed on the same locations as those described above with reference to FIGS. 1 and 2, respectively. In other words the first opening 15a is formed on the gate electrode 5g and the second opening 15b is extensively formed on the transmissive display electrode 11. Examples of a method of forming the partition wall 15 include a method of forming by photo-patterning using a photosensitive resin and a method of forming by combining formation of an insulating thin film and etching thereof. Examples of the insulating thin film include resin films such as a PMMA film and inorganic insulating films such as a silicon nitride (SiNx) film and a silicon oxide (SiOx) film.

Furthermore, to form the partition wall layer 15 having the openings 15a and 15b with reversely tapered side walls where inclined angles thereof are almost uniform, for example, lithography may be performed using a photosensitive resin under appropriately adjusted exposure conditions. Such lithography forms the partition wall layer 15 having the openings 15a and 15b with side walls of reversely tapered cross-sectional profiles. A partition wall having a multilayer structure 15 can also be formed by a similar method. For example, in order to form such a partition wall 15 using a photosensitive resin, the photosensitivity of a lower layer film as a first layer and that of a film as a second layer disposed on the first layer may be made different from each other. Alternatively, the first layer may be formed using a photosensitive resin and the second layer may be formed using a material that can selectively pattern the photosensitive resin of the first layer. Furthermore, when the formation of insulating thin films is combined with etching thereof, etching selectivity between the first layer and the second layer may be imparted.

Figure 3C:
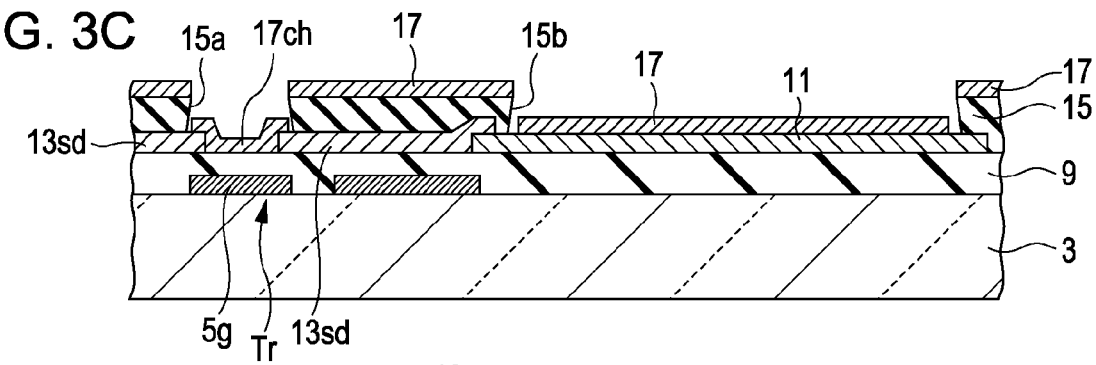

After the formation of such a partition wall layer 15, as shown in FIG. 3C, semiconductor layers 17 are deposited from above the partition wall layer 15. Therefore, a channel-region semiconductor layer 17c, which is a semiconductor layer 17, is formed on the bottom of the first opening 15a while being separated from another semiconductor layer 17 on the partition wall layer 15.

Here, for example, the semiconductor layer 17 may be deposited over the entire surface of the substrate 3 by a vacuum evaporation method. Thereby, a semiconductor layer 17 is provided on the bottom of the second opening 15b so as to be separate from the semiconductor layer 17 provided on the partition wall layer 15.

This semiconductor layer 17 is made of an organic semiconductor, such as pentacene, a thiophene oligomer (e.g., sexithiophene), or polythiophene. When a method, such as an ink jet method, by which both patterning and formation of a film can be simultaneously performed, is employed, the semiconductor layer 17 may be selectively formed only on the bottom surface of the first opening 15a in the partition wall 15, and the resulting semiconductor layer 17 may be used as the channel-region semiconductor layer 17ch.

Thus, the bottom-gate bottom-contact thin-film transistor Tr is prepared. In this thin-film transistor Tr, the source/drain electrodes 13sd are formed on the gate insulating film 9 covering the gate electrode 5g. In addition, the channel-region semiconductor layer 17ch is provided so as to be stacked above the gate electrode 5g from above the source/drain electrodes 13sd. In this thin-film transistor Tr, one of the source/ drain electrodes 13sd is used as an upper electrode of the capacitative element Cs and connected to the transmissive display electrode 11.

Figure 3D:
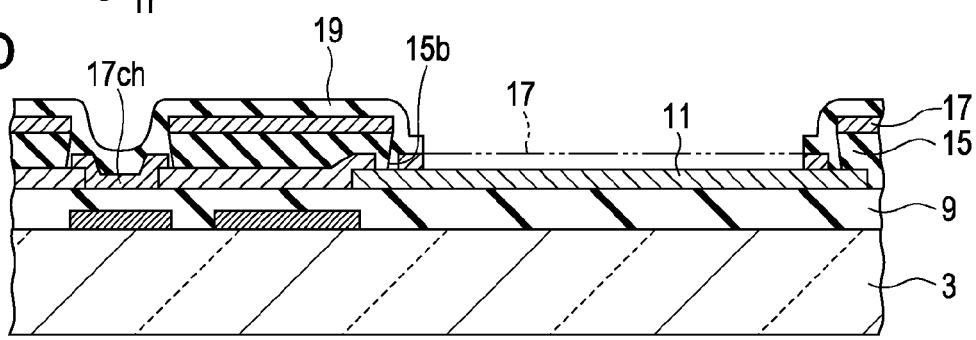

Subsequently, as shown in FIG. 3D, an insulating film 19 is deposited so as to cover the partition wall layer 15 and the semiconductor layers 17. The insulating film 19 may be formed without embedding the stepped portion of the partition wall layer 15 as shown in the figure or may be formed as a planarizing film having a flat surface. Furthermore, when the insulating film 19 has an irregular surface, it is preferable that the side walls of the openings 15a and 15b has a usual tapered cross-sectional profile instead of a reversely tapered cross-sectional profile. In addition, this insulating film 19 may have a single-layer structure or a laminated structure.

Such an insulating film 19 is made of silicon nitride; silicon oxide; acrylic resin such as polyparaxylene, polyvinyl alcohol, polyvinyl phenol, or PMMA; or the like.

Next, the semiconductor layer 17 is exposed at the bottom of the second opening 15b of the partition wall layer 15 by pattern-removal of the semiconductor layer 19 from the transmissive display electrode 11. Here, the insulating film 19 may be formed so as to be widely opened on the transmissive display electrode 11 by a printing method or the like in advance.

Then the transmissive display electrode 11 is exposed from the bottom of the second opening 15b by removing the semiconductor layer 17 from the transmissive display electrode 11 corresponding to the bottom of the second opening 15b. In this case, the removal of the semiconductor layer 17 is performed using a resist pattern used in the pattern removal of the insulating film 19 or etching with the insulating film 19 itself.

Figure 3E:
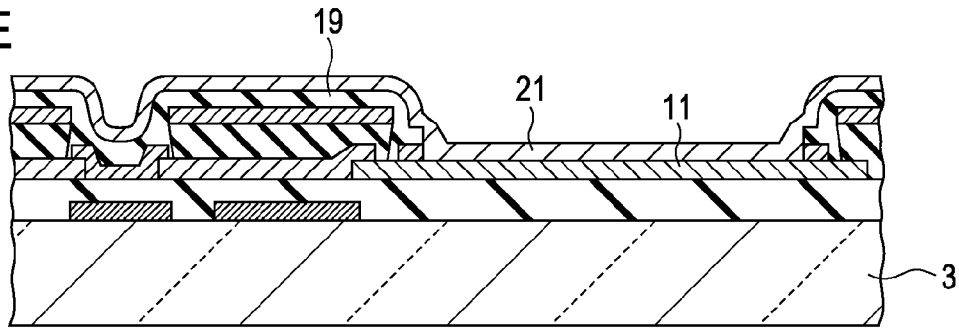

Subsequently, as shown in FIG. 3E, an oriented film 21 is disposed from above the substrate 3 so as to cover the transmissive display electrode 11. As a result, the drive-side substrate 3 (namely, the backplane of the display device) is completed.

After that, as shown in FIG. 2, a common electrode 33 made of a transmissive conductive material and an oriented film 35 are formed one by one on an opposing substrate 31 made of a transparent material. Then, the substrate 3 and the opposing substrate 31 are arranged face-to-face with each other while the oriented film 21 and the oriented film 35 face to each other. A spacer (not shown) is disposed between the substrates 3 and 31 and a liquid crystal layer LC is then introduced and enclosed therein. Consequently, a transparent liquid crystal display device 1-1 is completed.

In the first embodiment as described above, the channel-region semiconductor layer 17ch is formed on the bottom of the first opening 15a by the deposition thereof from above the partition wall layer 15 while being separated from the semiconductor layer 17 on the partition wall layer 15. Therefore, the channel-region semiconductor 17ch can be separated from other semiconductor layers 17 and finely pattered. Besides, the second opening 15b is formed together with the first opening 15a in the partition wall layer 15 and exposes an area where the transmissive display electrode 11 is formed. The semiconductor layer 17 formed on the bottom of the second opening 15b is removed therefrom. Thus, light passing through the transmissive display electrode 11 can be taken out without influencing the semiconductor layer 17 and the partition layer 15.

As a result, although the channel-region semiconductor layer 17ch is finely isolated and patterned by the deposition from above the partition wall layer 15, display light can be obtained without any influence on the partition wall layer 15 and the semiconductor layer 17 remained on the top thereof.

Therefore, it becomes possible to improve the image quality of the display device 1-1 having the transmissive display electrode 11.

Second Embodiment

Figure 4:
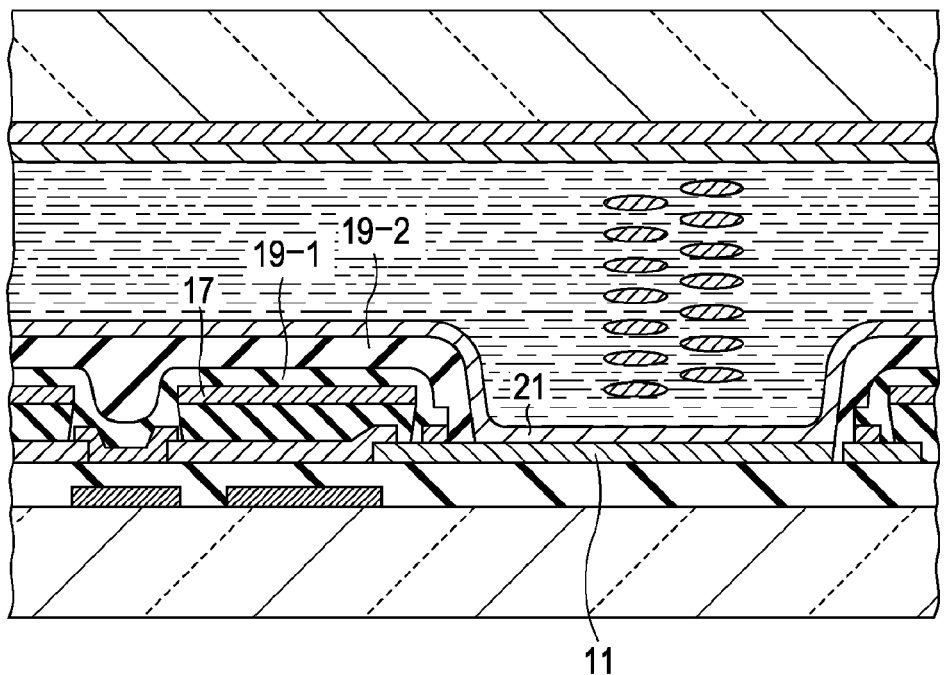
FIG. 4 is a cross-sectional view of part of a display device, which corresponds to one of pixels, according to a second embodiment of the present invention.

FIG. 4 is a schematic cross-sectional view of a display device 1-2 according to a second embodiment of the present invention, corresponding to the section along the line II-II in FIG. 1. The display device 1-2 shown in the figure has the same structural components as those of the display device of the first embodiment illustrated in FIG. 2, except that an insulating film has a bilayer structure. In other words, the insulating film 19 formed as a protective layer of the channel-region semiconductor layer 17ch is provided as a protective insulating film 19-1. In addition, a planarizing insulating film 19-2 is formed on the protective insulating film 19-1 so as to make an opening on a transmissive display electrode 11. Furthermore, an oriented film 21 is formed on this planarizing insulating film 19-2.

In a method of manufacturing the display device 1-2 constructed as described above, the same procedures as those of the first embodiment illustrated in FIG. 3A to FIG. 3D are performed until a semiconductor layer 17 on a transmissive display electrode 11 is removed. After that, a planarizing insulating film 19-2 may be formed on a substrate 3, and the pattern formation of an opening to expose a transmissive display electrode 11 to the planarizing insulating film 19-2 and an oriented film 21 may be then formed thereon. A method of forming the planarizing insulating film 19-2 is not specifically limited. The planarizing insulating film 19-2 may be formed by a printing method or the like so as to perform the pattern formation of an opening for exposing the transmissive display electrode 11 in advance.

According to the second embodiment as described above, a channel-region semiconductor layer 17ch is formed on the bottom of a first opening 15a formed in a partition wall layer 17. In addition, a second opening 15b for exposing an area where the transmissive display electrode 11 is formed is formed in the partition wall layer 15 and the semiconductor layer 17 formed on the bottom of the second opening 15b is then removed therefrom. As a result, the display device 1-2 can obtain display light without any influence on the partition wall layer 15 and the semiconductor layer 17 remained on the top thereof, while having the fine channel-region semiconductor layer 17ch.

Third Embodiment

Figure 5:
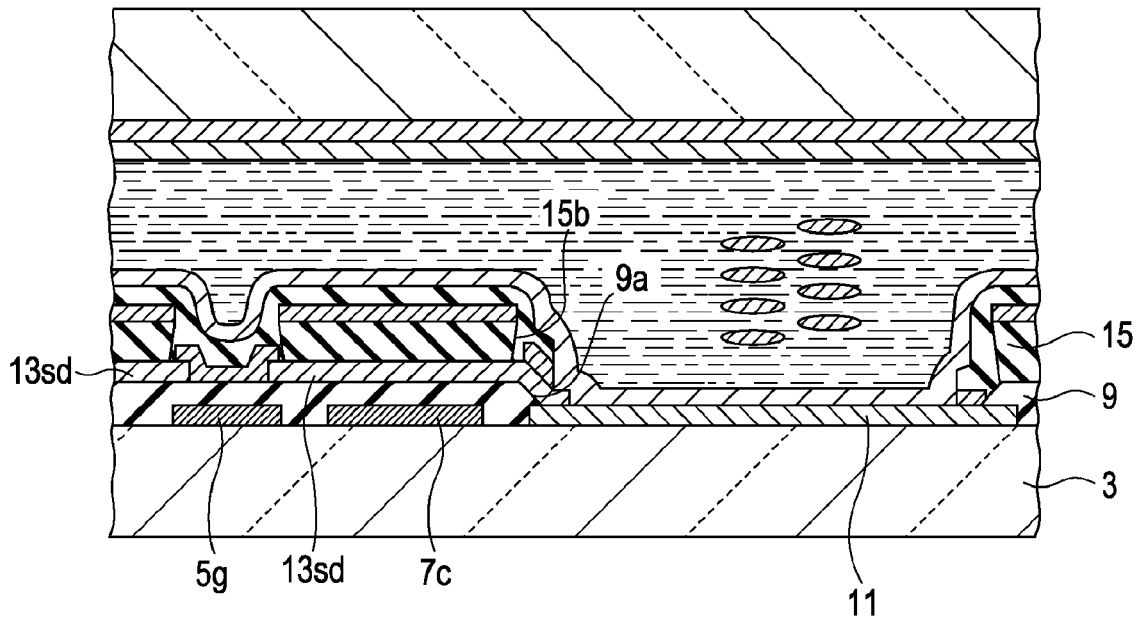
FIG. 5 is a cross-sectional view of part of a display device, which corresponds to one of pixels, according to a third embodiment of the present invention.

FIG. 5 is a schematic cross-sectional view of a display device 1-3 according to a third embodiment of the present invention, corresponding to the section along the line II-II in FIG. 1. The display device 1-3 shown in the figure has the same structural components as those of the display device of the first embodiment illustrated in FIG. 2, except that a transmissive display electrode 11 is included in the same first layer as that of a gate electrode 5g and a lower electrode 7c.

In other words, the first layer on a substrate 3 includes the transmissive display electrode 11 in addition to the gate electrode 5g and the lower electrode 7c. Furthermore, an opening 9a is formed in a gate insulating film 9 formed on the top of the gate electrode 5g and extensively opened on the transmissive display electrode. The opening 9a allows the source/drain electrodes 13sd on the gate insulating film 9 to be connected to the transparent electrode 11.

A method of manufacturing the display device constructed as described above includes, first, forming a gate electrode 5g and a lower electrode 7c on a substrate 3, and forming a transmissive display electrode 11 made of a transmissive conductive material. Both the gate electrode 5g and the lower electrode 7c may be made of a transmissive conductive material, respectively. In this case, the gate electrode 5g, the lower electrode 7c, and the transmissive display electrode 11 may be formed in the same step.

Furthermore, a gate insulating film 9 is formed and an opening 9a is then formed in the gate insulating film 9. The opening 9a is extensively opened on the transmissive display electrode 11. Subsequently, source/drain electrodes 13sd connected to the transmissive display electrode 11 are formed on the gate insulating film 9.

The subsequent steps may be performed until an oriented film 21 is formed by the same procedures as those described above with reference to FIG. 3B to FIG. 3E.

According to the third embodiment as described above, the channel-region semiconductor layer 17c is formed on the bottom of the first opening 15a formed in the partition wall layer 15. In addition, the second opening 15b that exposes an area where the transmissive display electrode 11 is formed is formed in the partition wall layer 15. In addition, the semiconductor layer 17 formed on the bottom of the second opening 15b is removed therefrom. Therefore, like the first embodiment, the display device 1-2 can obtain display light without any influence on the partition wall layer 15 and the semiconductor layer 17 remained on the top thereof, while having the fine channel-region semiconductor layer 17ch.

Fourth Embodiment

Figure 6:
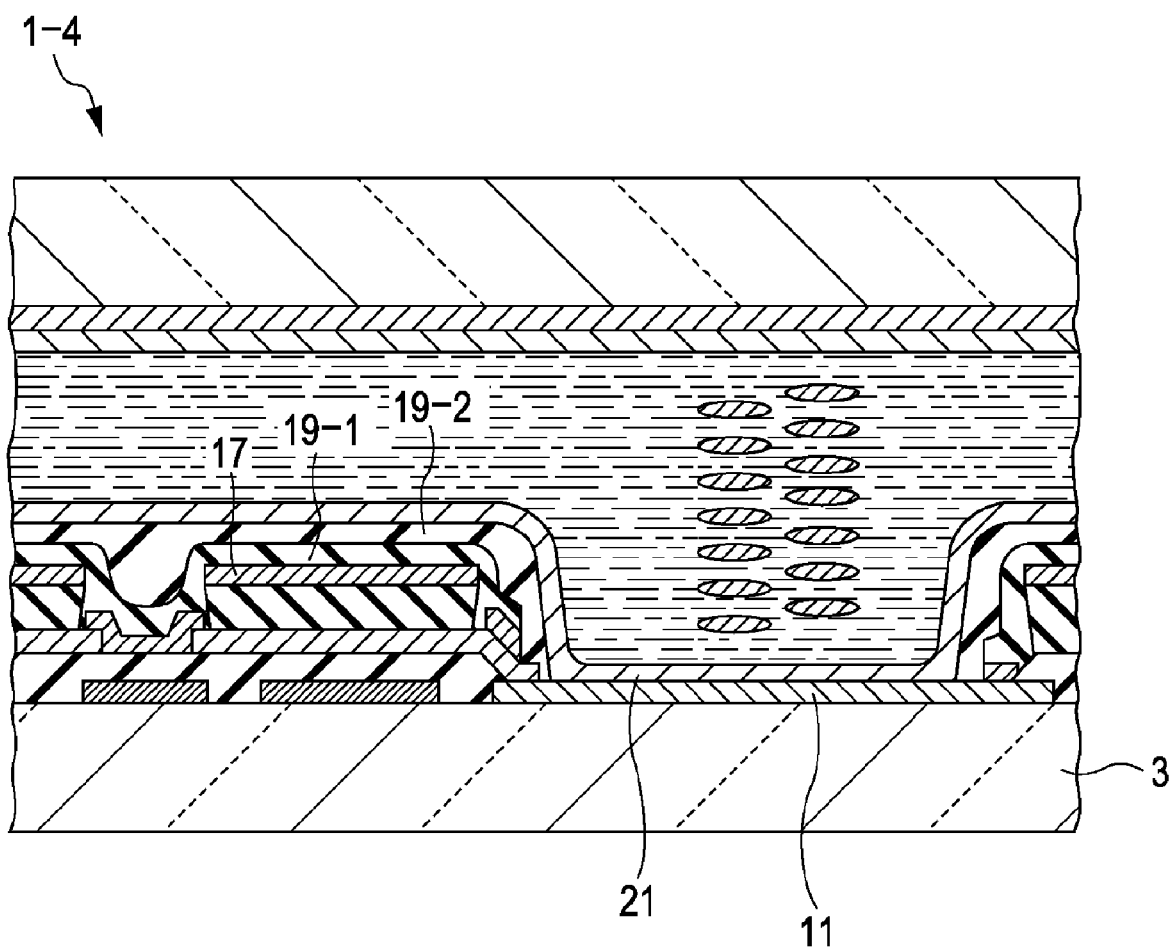
FIG. 6 is a cross-sectional view of part of a display device, which corresponds to one of pixels, according to a fourth embodiment of the present invention.

FIG. 6 is a schematic cross-sectional view of a display device 1-4 according to a fourth embodiment of the present invention, corresponding to the section along the line II-II in FIG. 1. The display device 1-4 shown in the figure is a combination of the configurations of the display devices according to the second and third embodiments. In other words, the display device 1-4 includes the same components as those of the display device of the third embodiment shown in FIG. 5, except for a bilayered structure of an insulating film.

In other words, the insulating film 19 formed as a protective layer of the channel-region semiconductor layer 17ch is provided as a protective insulating film 19-1. In addition, a planarizing insulating film 19-2 is formed on the protective insulating film 19-1 so as to make an opening on a transmissive display electrode 11. Furthermore, an oriented film 21 is formed on this planarizing insulating film 19-2.

According to the fourth embodiment as described above, the channel-region semiconductor layer 17ch is formed on the bottom of the first opening 15a formed in the partition wall layer 15. In addition, the second opening 15b that exposes an area where the transmissive display electrode 11 is formed is formed in the partition wall layer 15.

In addition, the semiconductor layer 17 formed on the bottom of the second opening 15b is removed therefrom. Like the first embodiment, the display device 1-2 can obtain display light without any influence on the partition wall layer 15 and the semiconductor layer 17 remained on the top thereof even it includes the fine channel-region semiconductor layer 17ch.

Fifth Embodiment

Figure 7:
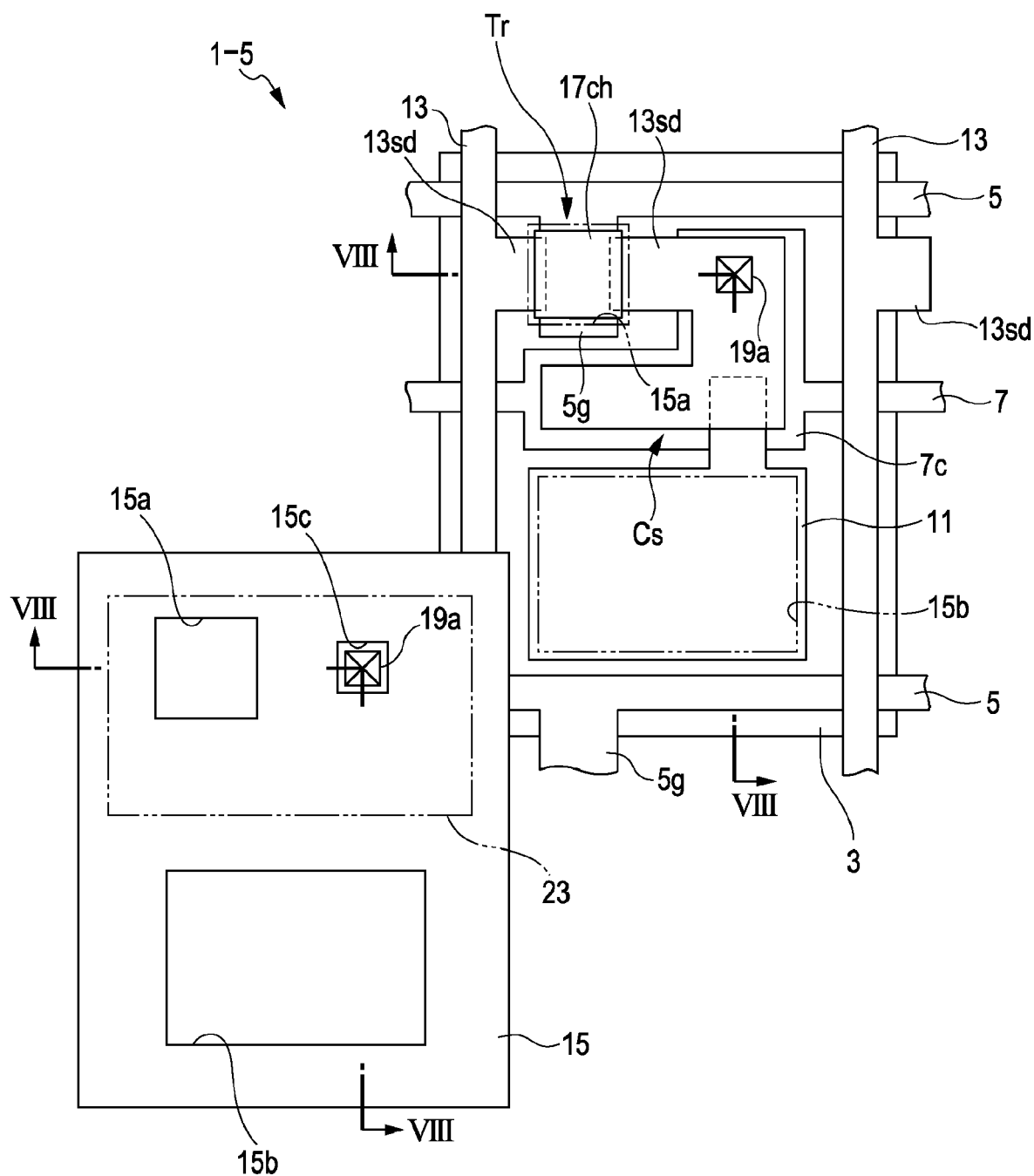
FIG. 7 is a schematic plan view of part of a drive-side substrate, which corresponds to one of pixels, of a display device using a bottom-gate type thin-film transistor according to any of fifth to seventh embodiments an eighth embodiment of the present invention.
Figure 8:
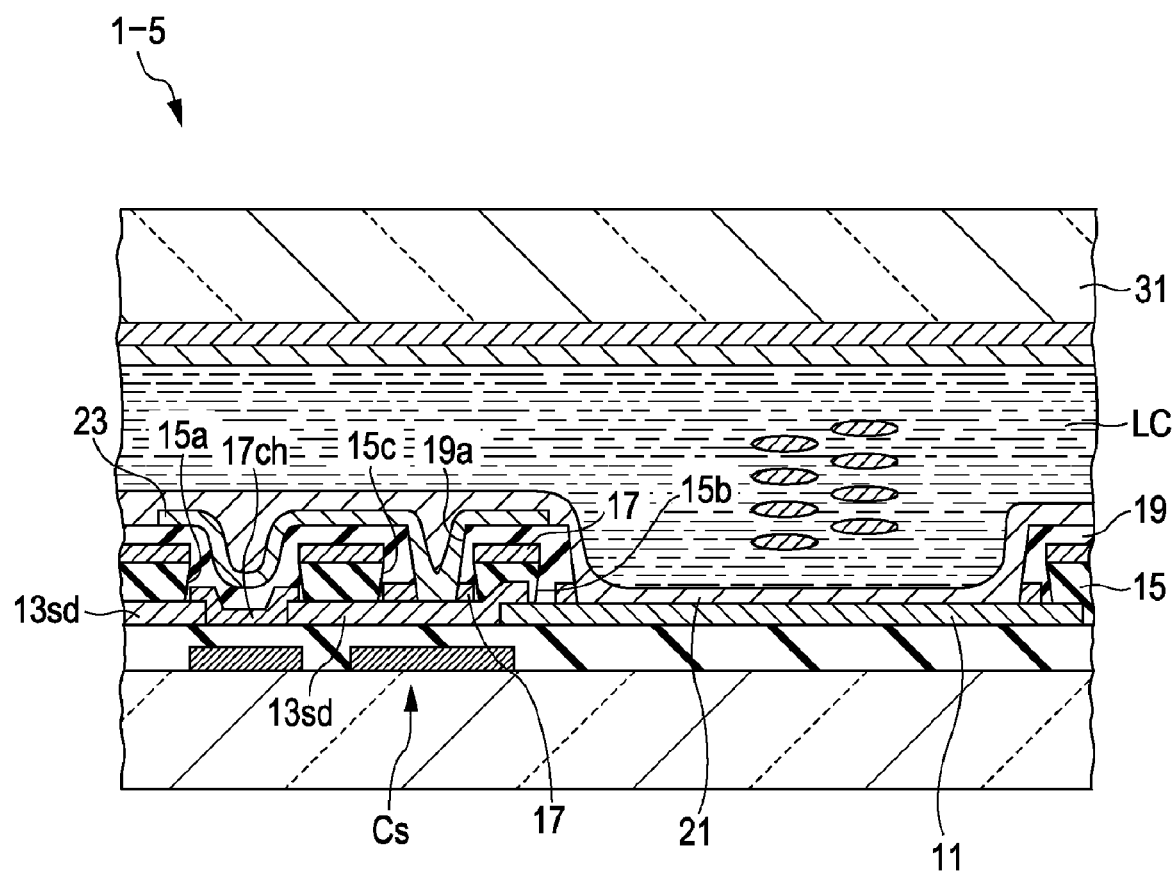
FIG. 8 is a cross-sectional view of part of a display device, which corresponds to one of pixels, according to a fifth embodiment of the present invention.

FIG. 7 is a schematic plan view of part of a drive-side substrate, which corresponds to one of pixels, of a semitransmissive/semireflective liquid crystal display apparatus according to a fifth embodiment of the present invention. In addition, FIG. 8 is a schematic cross-sectional view of a display device 1-5 according to the fifth embodiment of the present invention, corresponding to the section along the line VIII-VIII in FIG. 7.

The display device 1-5 shown in the figures has the same structural components as those of the display device of the first embodiment illustrated in FIG. 2, except that a reflective pixel electrode is formed together with a transmissive display electrode 11 and an additional structure for mounting such a reflective pixel electrode 23.

In other words, in the fifth embodiment, a partition wall layer has a first opening 15a corresponding to a channel region of a thin-film transistor Tr, a second opening 15b for exposing the transmissive display electrode 11, and a third opening 15c extending to source/drain electrodes 13sd that constitute a capacitive element Cs. The partition wall layer 15 having these three openings 15a, 15b, and 15c is covered with an insulating layer 19 that serves as a channel-region semiconductor layer 17ch like the one according to any of the aforementioned embodiments. Here, the insulating film 19 is preferably provided as a planarizing film or the like.

Furthermore, in the third opening 15c, a connection hole 19a extending to source/drain electrodes 13sd that constitute a capacitive element Cs is formed in the insulating films 19 and the semiconductor layers, which cover the partition wall layers 15.

The connection hole 19a is formed so as to keep the insulation thereof to the semiconductor layer 17 on the partition wall layer 15.

A reflective pixel electrode 23 is formed on part of the insulating film 19 so as to avoid the second opening 15b and is connected to the source/drain electrodes 13sd on the bottom of the connection hole 19a in the third opening 15c. Therefore, the reflective pixel electrode 23 is connected to a transmissive display electrode 11 through the source/drain electrodes 13sd and is able to receive a potential equal to one applied to the transmissive display electrode 11.

In addition, the reflective pixel electrode 23 is arranged on the partition wall layer 15 and the insulating film 19 covering such a layer 15 and designed to have a height different from that of the transmissive display electrode 11. The height of the reflective pixel electrode 23 corresponds to the value of a cell gap of a liquid crystal layer LC between a transmissive display section where the transmissive display electrode 11 is formed and a reflective display part where the reflective pixel electrode is formed 23. In addition, the height of the reflective pixel electrode 23 can be adjusted by the partition wall layer 15 and the insulating film 19 covering such a layer 15. In addition, the insulating film 19 may be formed without embedding the stepped portion of the partition wall layer 15 as shown in the figure or may be formed as a planarizing film having a flat surface.

Furthermore, an oriented film 21 is formed so as to cover the transmissive display electrode 11 and the reflective pixel electrode 23 as described above.

In such a display apparatus 1-5, the transmissive display section where the transmissive display electrode receives light incident from the substrate 3 through a deflecting plate. Subsequently, like the first embodiment, the light passes through the transmissive display electrode 11 and extends to the liquid crystal layer LC. Then, only light, which is in a certain polarization state caused by passing through the liquid crystal layer LC oriented in a predetermined direction depending on the state of voltage application to both the transmissive display electrode and the common electrode 33, can pass through a polarization plate on the side of the opposing substrate 31 and can be taken out as display light.

In contrast, the reflective display part where the reflective pixel electrode 23 is arranged receives light incident from the opposing substrate 31 through a deflecting plate. Subsequently, the light passes through the liquid crystal layer LC and reflects on the reflective pixel electrode 23, followed by passing through the liquid crystal layer LC again. Under such circumstances, only light, which is in a certain polarization state caused by reciprocately passing through the liquid crystal layer LC oriented in a predetermined direction depending on the state of voltage application to both the reflective pixel electrode 23 and the common electrode 33, can pass through a polarization plate on the side of the opposing substrate 31 again and can be taken out as display light.

Referring now to FIG. 9, a method of manufacturing the display device 1-5 constructed as described above will be described. FIGS. 9A to 9E are cross-sectional diagrams corresponding the respective steps of the method.

Figure 9A:
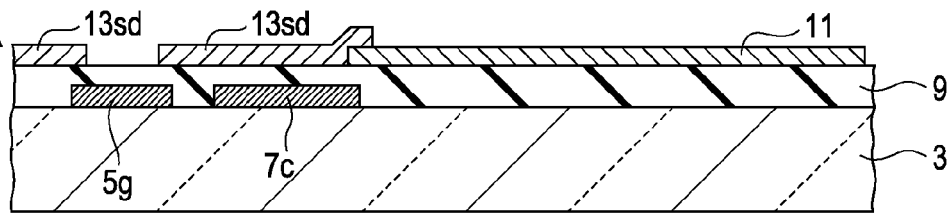
FIG. 9A to FIG. 9E illustrate the respective steps.

First, as shown in FIG. 9A, the same steps as those of the first embodiment are performed until a gate electrode 5g and a lower electrode 7c are formed on a substrate 3 and covered with a gate insulating film 9, a transmissive display electrode 11 is formed thereon, and source/drain electrodes 13sd are formed.

Figure 9B:
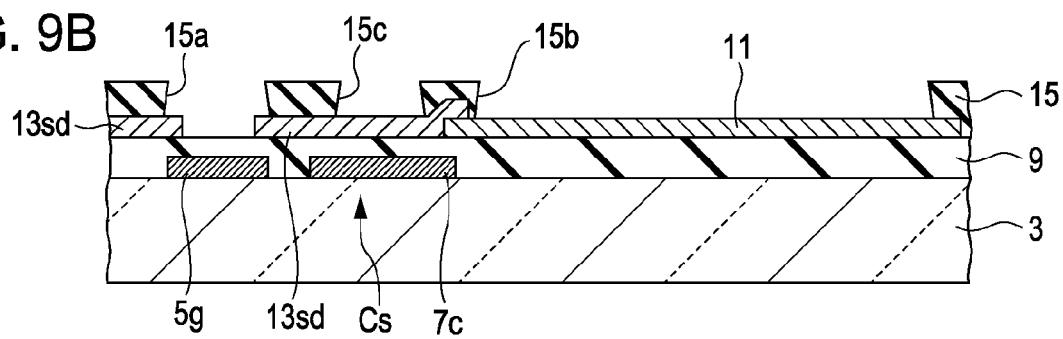

Next, as shown in FIG. 9B, a first opening 15a, a second opening 15b, and a third opening 15c are formed in the gate insulating film 9 on which the transmissive display electrode 11 and the source/drain electrodes 13sd are formed. These openings 15a, 15b, and 15c have side walls of reversely tapered cross-sectional profiles. Furthermore, the respective openings 15a, 15b, and 15c are formed and positioned in a manner similar to those described above with reference to FIG. 7 and FIG. 8. In other words, the first opening 15a is formed on the gate electrode 5g, the second opening 15b is formed on an extensive area on the transmissive display electrode 11, and the third opening 15c is formed on the source/drain electrodes 13sd that constitute a capacitive element Cs. In addition, a method of forming such a partition wall layer 15 may be similar to that of the first embodiment.

Figure 9C:
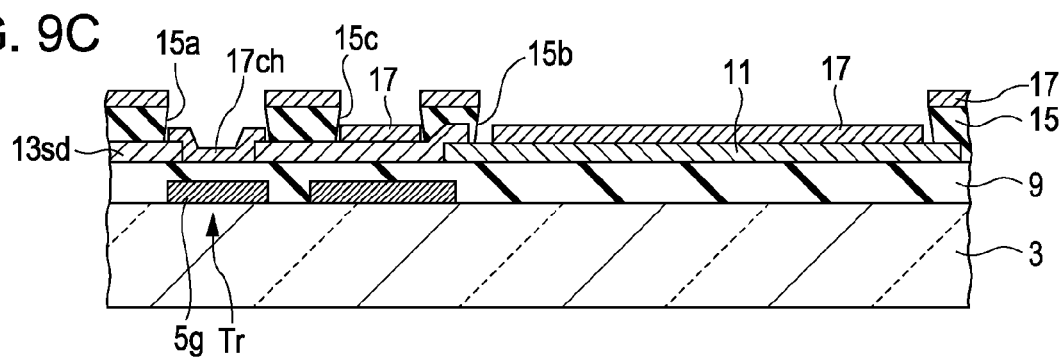

After the formation of the above-described partition wall layer 15, as shown in FIG. 9C, a semiconductor layer 17 is deposited from above the partition wall layer 15. Thus, a channel-region semiconductor layer 17ch composed of the semiconductor layer 17 is formed on the bottom of the first opening 15a so as to be separate from a semiconductor layer 17 disposed on the partition wall layer 15. The formation of the semiconductor layer 17 is performed in a manner similar to that of the first embodiment.

Figure 9D:
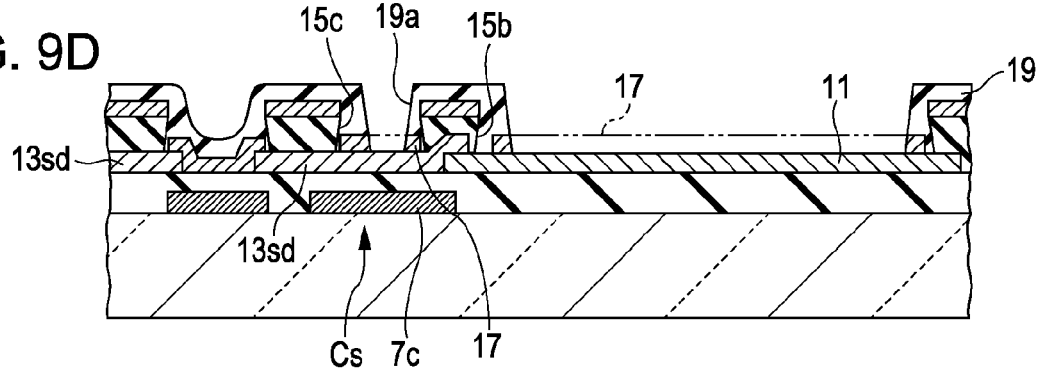

Subsequently, as shown in FIG. 9D, an insulating film 19 is formed so as to cover the partition wall layer 15 and the semiconductor layers 17. Here, the insulating film 19 is preferably formed as a planarizing film. Next, the semiconductor layer 17 is exposed at the bottom of the second opening 15b of the partition wall layer 15 by pattern-removal of the semiconductor layer 19 from the transmissive display electrode 11. In this case, furthermore, the insulating film 19 on the bottom of the third opening 15c of the partition wall layer 15 is removed therefrom and a connection hole 19c is then formed to expose the semiconductor layer 17 to the bottom of the connection hole 19a.

The formation of such an insulating film 19 is performed in a manner similar to that of the first embodiment. Alternatively, the insulating film 19 may be formed by a printing method or the like so as to have a connection hole 19a while being extensively opened on the transmissive display electrode 11 in advance. Furthermore, the insulating film 19 may be provided as a reflow film. In this case, a reflow process may be performed on the insulting film 19 already having the connection hole 19. Thus, the opening-edge portion 19a of the connection hole 19a can be rounded and a reflective pixel electrode to be formed next is then prevented from being cut stepwise. In addition, the insulating film 19 may be formed without embedding the stepped portion of the partition wall layer 15 as shown in the figure or may be formed as a planarizing film having a flat surface.

Then the transmissive display electrode 11 is exposed from the bottom of the second opening 15b by removing the semiconductor layer 17 from the transmissive display electrode 11 corresponding to the bottom of the second opening 15b, while the semiconductor layer 17 on the bottom of the connection hole 19 is removed to expose the source/drain electrodes 13sd.

Figure 9E:
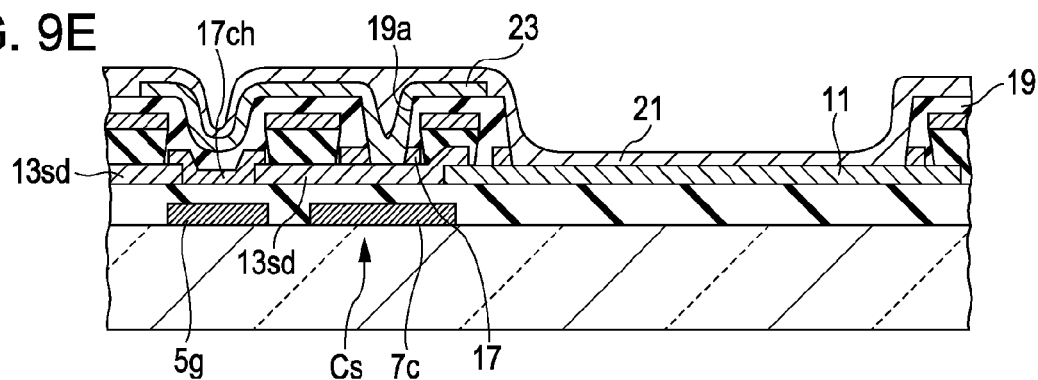

Subsequently, as shown in FIG. 9E, a reflective pixel electrode 23 connecting to the source/drain electrodes 13sd is formed on the insulating film 19 through the connection hole 19a. Next, an oriented film 21 is disposed from above the substrate 3 so as to cover the transmissive display electrode 11 and the reflective pixel electrode 23. As a result, the drive-side substrate 3 (namely, the backplane of the display device) is completed.

After that, as shown in FIG. 8, a common electrode 33 made of a transmissive conductive material and an oriented film 35 are formed one by one on an opposing substrate 31 made of a transparent material. Then, the substrate 3 and the opposing substrate 31 are arranged face-to-face with each other while the oriented film 21 and the oriented film 35 face to each other. A spacer (not shown) is disposed between the substrates 3 and 31 and a liquid crystal layer LC is then introduced and enclosed therein. Consequently, a semitransmissive/semi reflective liquid crystal display device 1-5 is completed.

Even in the case of the semitransmissive/semireflective display device 1-5 of the fifth embodiment as described above, the channel-region semiconductor layer 17ch is formed on the bottom of the first opening 15a formed in the partition wall layer 15. In addition, a second opening 15b for exposing an area, where the transmissive display electrode 11 is formed, is formed in the partition wall layer 15 and the semiconductor layer 17 formed on the bottom of the second opening 15b is then removed therefrom. Like the first embodiment, in the transmissive display section, the display device 1-5 can obtain display light without any influence on the partition wall layer 15 and the semiconductor layer 17 remained on the top thereof, while having the fine channel-region semiconductor layer 17ch. In addition, the effective pixel electrode 23 is pulled out above the semiconductor layer 17. Therefore, display light can be obtained without being influenced by the semiconductor layer 17 even in the case of reflection display.

Furthermore, the reflective pixel electrode 23 and the transmissive display electrode 11 may be directly connected to each other on a portion where the second insulating film 19-2 is removed. In this case, it is not necessary to form the third opening 15c in the partition wall layer 15. In addition, it is not necessary to form the connection hole 19a in the insulating film 19.

Sixth Embodiment

Figure 10:
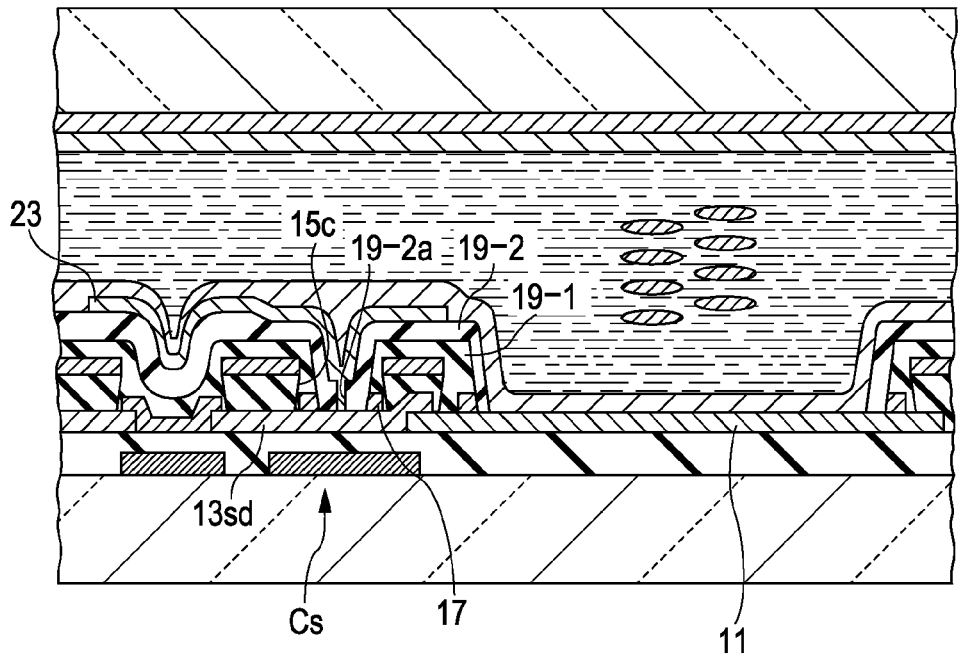
FIG. 10 is a cross-sectional view of part of a display device, which corresponds to one of pixels, according to a sixth embodiment of the present invention.

FIG. 10 is a schematic cross-sectional view of a display device 1-3 according to a sixth embodiment of the present invention, corresponding to the section along the line VIII-VIII in FIG. 7. The display device 1-6 shown in the figure has the same structural components as those of the display device of the first embodiment illustrated in FIG. 8, except that an insulating film has a bilayer structure.

In other words, the insulating film 19 formed as a first protective layer of the channel-region semiconductor layer 17*ch* is provided as a first insulating film 19-1. In addition, an insulating film 19-2 is formed in a shape of covering the isolative film 19-1 and opening on the transmissive display electrode 11. The second insulating film 19-2 is formed so as to cover the inner wall of the opening formed in the first insulating film 19-1. The insulating films 19-1 and 19-2 may be formed without embedding stepped portions caused by the partition wall layers 15 as shown in the figure or may be formed as a planarizing film having a flat surface. In addition, a second connection hole 19-2*a* is formed in the second insulating film 19-2. The second connection hole 19-2*a* reaches the source/drain electrodes 13*sd* in the connection hole 19*a* formed in the first insulating film 19-1.

Furthermore, a reflective pixel electrode 23 connected to the source/drain electrodes 13*sd* through the second connection hole 19-2*a* is formed on the second insulating film 19-2.

Even in the case of the display device 1-6 constructed as described above, like the semitransmissive/semireflective display device 1-5 of the fifth embodiment, the display device 1-6 can obtain display light without any influence on the semiconductor layer 17 in each of the transmissive display section and the reflective display section while having the fine channel-region semiconductor layer 17*ch*.

Furthermore, the isolative films 19-1 and 19-2 have laminated structures, respectively. Therefore, any stepped portion caused by the partition wall layer 15 for patterning the channel-region semiconductor layer 17*ch* can be eased or the upper edge of the connection hole 19*a* of the first insulating film 19-1 can be covered with the second insulating film 19-2 while rounding the corners. Therefore, the reflective pixel electrode 23 formed on the upper part thereof can be prevented from being stepwisely cut.

Furthermore, the second insulating film 19-2 may be removed from the transmissive display electrode 11. In this case, the second insulating film 19-2 may not be optically transparent. In this case, furthermore, the reflective pixel electrode 23 and the transmissive display electrode 11 may be directly connected to each other on a portion where the second insulating film 19-2 is removed. As long as the reflective pixel electrode 23 and the transmissive display electrode 11 are directly connected to each other, it is not necessary to form the third opening 15*c* in the partition wall layer 15. Also, it is not necessary to form a connection hole 19*a* in the insulating film 19.

Seventh Embodiment

Figure 11:
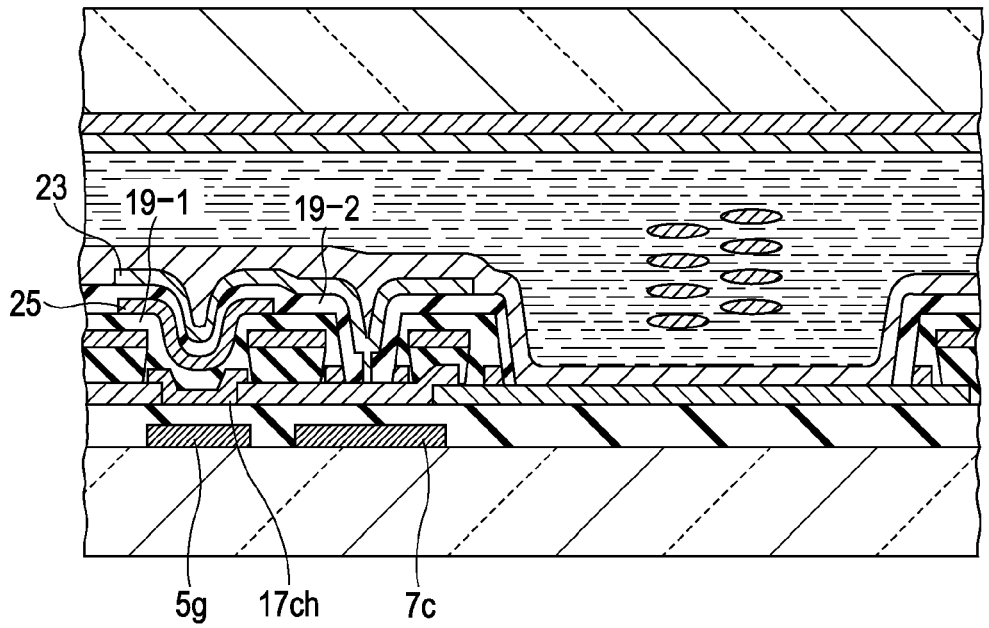
FIG. 11 is a cross-sectional view of part of a display device, which corresponds to one of pixels, according to a seventh embodiment of the present invention.

FIG. 11 is a schematic cross-sectional view of a display device 1-7 according to a seventh embodiment of the present invention. The display device 1-7 shown in the figure has the same structural components as those of the display drive of the first embodiment illustrated in FIG. 10, except that a shield layer 25 is arranged between a first insulating film 19-1 and a second insulating film 19-2.

In other words, the shield layer 25 is made of a conductive material and disposed between the first insulating film 19-1 and the second insulating film 19-2 at a position where the shield layer 25 is stacked on a channel-region semiconductor layer 17*ch*.

A method of manufacturing a display device having such a shield layer 25 includes the step of forming a shield layer 25 on a first insulating film 19-1 after the formation of the first insulating film 19-1 but before the formation of a second insulating film 19-2. For example, a method of forming such a shield layer 25 may be performed in a manner similar to the formation of a gate electrode 5*g* and a lower electrode 7*c*, but is not specifically limited thereto.

In the seventh embodiment as described above, in addition to the advantageous effects of the sixth embodiment, the shield layer 25 disposed between the reflective pixel electrode 23 and the channel-region semiconductor layer 17*ch* is formed. Thus, the potential of the reflective pixel electrode 23 does not affect on the channel-region semiconductor layer 17*ch*, so that so-called a back-channel effect can be prevented. Therefore, the display device 1-7 of the present embodiment can exert an advantageous effect of reducing the operating voltage of the thin-film transistor Tr.

Eighth Embodiment

Figure 12:
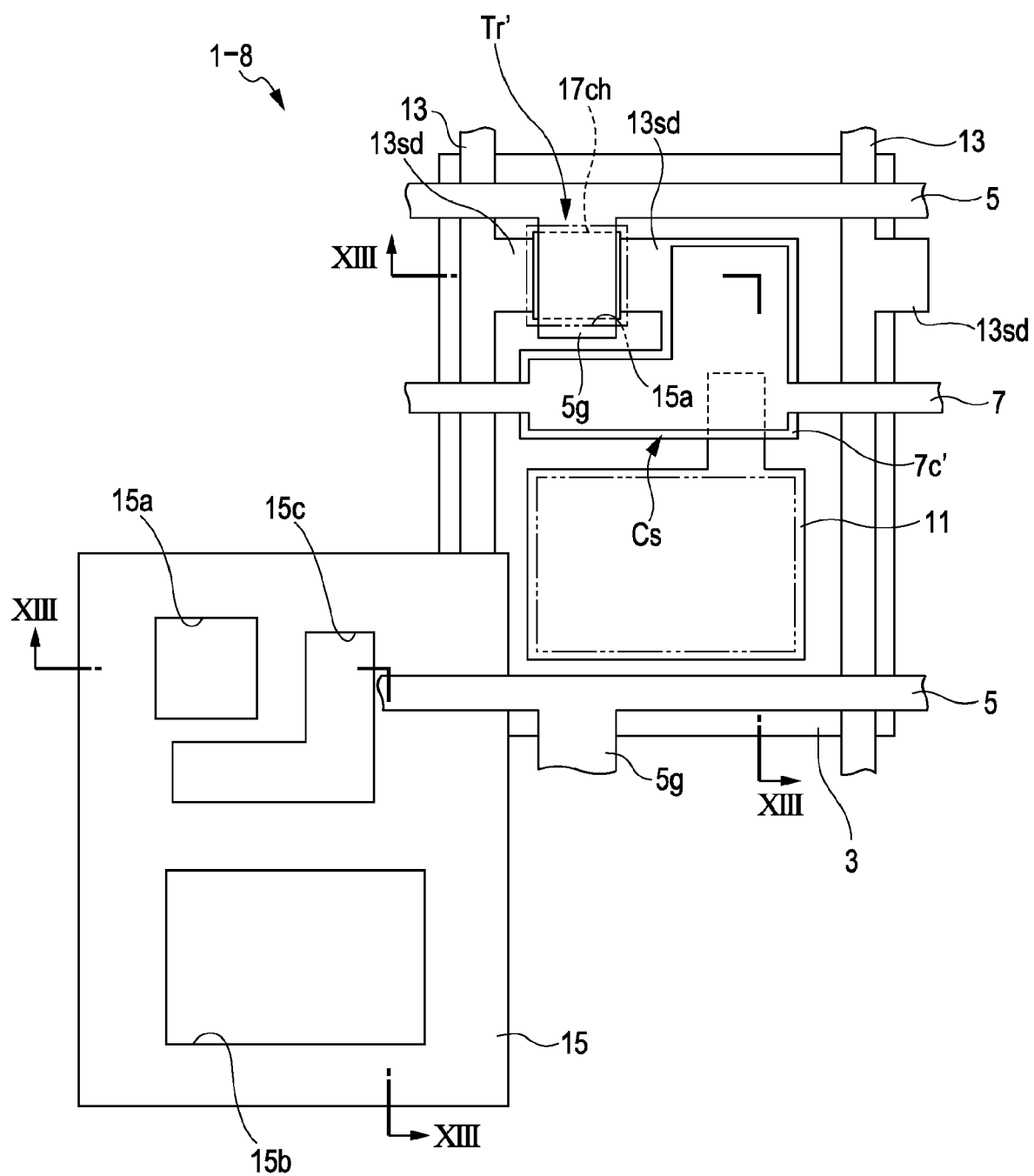
FIG. 12 is a schematic plan view of part of a drive-side substrate, which corresponds to one of pixels, of a display device using a top-gate type thin-film transistor according to an eighth embodiment of the present invention.
Figure 13:
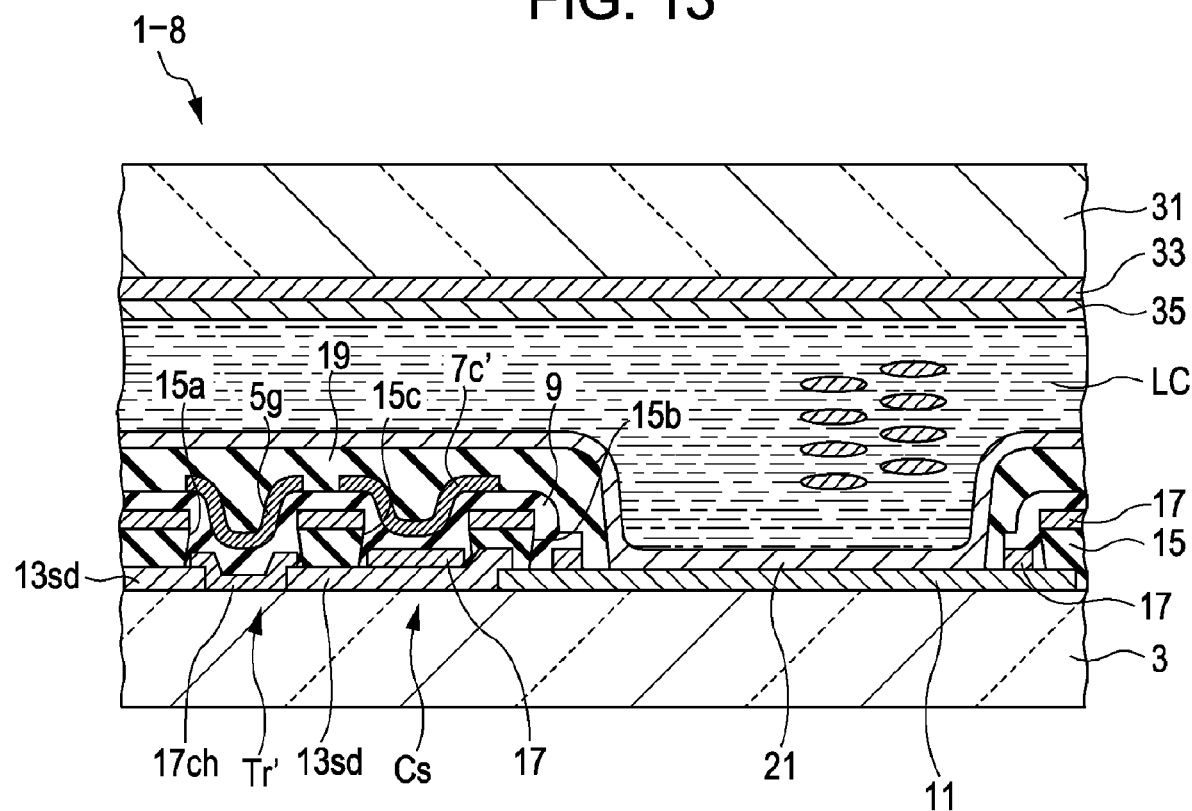
FIG. 13 is a cross-sectional view of part of a display device, which corresponds to one of pixels, according to the eighth embodiment of the present invention.

FIG. 12 is a schematic plan view of part of a drive-side substrate, which corresponds to one of pixels, of a display device 1-8 according to an eighth embodiment of the present invention. Here, a top-gate type thin-film transistor Tr' is employed as a pixel-drive thin-film transistor. In addition, FIG. 13 is a schematic cross-sectional view of a display device 1-8 according to the eighth embodiment of the present invention, corresponding to the section along the line XIII-XIII in FIG. 12. The same components as those in the preceding embodiment are assigned the same reference numerals, and a description of the common structure is omitted.

In the display apparatus 108 shown in the figures, a first layer on a drive-side substrate 3 includes a transmissive display electrode 11 and a plurality of signal lines 13 being wired in a vertical direction. From each signal line 13, one of source/drain electrodes 13*sd* of the thin-film transistor Tr extends in a horizontal direction. In addition, the first layer includes the other of source/drain electrodes 13*sd* facing the first and serving as a lower electrode of a capacitative elements. The ends of the source/drain electrodes 13*sd* are placed on the ends of the transmissive display electrode 11, so that they can be directly connected to the transmissive display electrode 11. In addition, in a stacked state between the transmissive display electrode 11 and the source/drain electrode 13*sd*, as shown in the figure, the end of the source drain electrode 13*sd* may be placed on the end of the transmissive display electrode 11 or vice versa.

Furthermore, an insulating partition wall layer 15 like the one of the first embodiment is formed on the upper side of the substrate 3 on which the transmissive display electrodes 11, the signal lines 13, and the source/drain electrodes 13*sd* are formed as described above. The partition wall layer 15 includes a first opening 15*a* and a second opening 15*b*, which are similar to those of the first embodiment. In addition, a third opening 15*c* extending to the source/drain electrodes 13*c* that constitute a capacitative element Cs is also formed.

In other words, the first opening 15*a* is located at a position corresponding to the channel region of a thin-film transistor Tr', or a position between the source/drain electrodes 13*sd*. The second opening 15*b* is established so that the opening of the transmissive display electrode 11 top may be carried out widely. The third opening 15*c* is formed at a position extending to one of the source/drain electrodes 13*sd* of the thin-film transistor Tr', which is on the side where the lower electrode of the capacitative element Cs is constructed.

Furthermore, like the first embodiment, the partition wall layer 15 has a film thickness enough to separate semiconductor layers 17 to one on the upper part of the partition wall layer 15 and the other on the lower part thereof as described below. The side walls of the openings 15*a*, 15*b*, and 15*c* are perpendicularly disposed. More preferably, each of these side walls has a reversely tapered cross-sectional profile in which the diameter of the opening tapers toward the upper part of the opening.

A channel-region semiconductor layer 17*ch*, which constitutes an active layer of the think film transistor Tr', is formed on the bottom of the first opening 15*a* of the partition wall layer 15. The channel-region semiconductor 17*ch* is a semiconductor layer 17 (only shown in FIG. 13) formed from the upper part of the partition wall layer 15 and formed on the bottom of the first opening 15*a* while being separated from another semiconductor layer 17 on the partition wall layer 15. In addition, the semiconductor layer 17 located on the gate electrode 13 on the bottom of the second opening 15*b* is extensively removed therefrom to extensively expose the gate electrode 13 from the semiconductor layer 17. Furthermore, a semiconductor layer 17 is formed on the source/drain electrode 13*sd* on the bottom of the third opening 15*c*.

Then, a gate insulating film 9 (only shown in FIG. 13) is formed so as to cover the channel-region semiconductor layer 17*ch* and the semiconductor layer 17 in the third opening 15*c* as described above. The gate insulating film 9 on the transmissive display electrode 11 is removed therefrom.

In addition, on the gate insulating film 9, scan lines 5 and common lines 7 which are only illustrated in FIG. 12 are wired in a horizontal direction perpendicular to signal lines 13. Furthermore, pixels are provided for the intersections between the scan lines 5 and the signal lines 13, respectively. In each pixel, the transmissive display electrodes 11 are placed. From each scan line 5, the gate electrode 5*g* of the thin-film transistor Tr' extends to a position where it covers the channel-region semiconductor layer 17*c* located between the source/drain electrodes 13*sd*. In addition, the top-gate type thin-film transistor Tr' is constructed of a pair of source/drain electrodes 13*sd*, the channel-region semiconductor layer 17*c* formed over these source/drain electrodes 13*sd*, and the gate electrode 5*g* formed on the channel-region semiconductor layer 17*ch* through the gate insulating film 9.

In addition, an intermediate part of each common line 7 is patterned as an upper electrode 7*c'* of a capacitative element Cs. The upper electrode 7*c'* is arranged so that it may be placed on the source/drain electrode 13*sd*, which serves as a lower electrode, through the gate insulating film 9. Furthermore, on the bottom of the third opening 15*c*, the capacitative element Cs is constructed of the gate insulating film 9 and the semiconductor layer 17 which are disposed between the source/drain electrode 13*sd* serving as a lower electrode and the upper electrode 7*c'*.

Furthermore on the substrate on which the gate electrode 5*g* and the upper electrode 7*c'* are formed, an oriented film 21 is formed through the insulating film 19 (only shown in FIG. 13). Thus, the upper part of the drive-side substrate 3 is constructed. The insulating film 19 is preferably a protective film of the channel-region semiconductor layer 17*ch*, but the part thereof on the transmissive display electrode 11 is removed. However, when the insulating film 19 is made of a transparent material, the transmissive display electrode 11 may be also covered with the insulating film 19. In other words, the insulating film 19 is formed on the partition wall layer 15 and covers the first opening 15*a* including the channel-region semiconductor layer 17*ch*. In addition, the insulating film 19 may be formed as a planarizing film having a flat surface as shown in the figure or may be formed without embedding the stepped portions of the partition wall layer 15. The oriented film 21 is also formed so that it can serve as a protective film for covering the first opening 15*a* from the top of the insulating film 19 and covering the second opening 15*b* from the top of the transmissive display electrode 11.

On the other hand, an opposing substrate 31 (only shown in FIG. 13) like the one of the first embodiment is arranged facing one side of the driving substrate 3, were the transmissive display electrode 11 is formed as described above. That is, the opposing substrate 31 is made of an optically transparent material. On the surface of the opposing substrate 31 facing the transmissive display electrode 11, an optically transparent common electrode 33 made of a transmissive conductive material is formed. This electrode 33 is common to all pixels. In contrast, the oriented film 35 is formed in a state of covering such a common electrode 33. Furthermore, a liquid crystal layer LC and a spacer (not shown) are disposed between the oriented film 21 of the substrate 3 and the oriented film 35 of the opposing substrate 31.

In this way, the display device 1-8 is constructed. The display device 1-8 can perform transmissive display like the one the first embodiment performs.

Referring now to FIG. 14, a method of manufacturing the display device 1-8 constructed as described above will be described. FIGS. 14A to 14E are cross-sectional diagrams corresponding the respective steps of the method.

First, as shown in FIG. 14A, an optically transparent substrate 3 is prepared and a transmissive display electrode 11 is then formed on the upper part thereof. Furthermore, signal lines are wired on the substrate 3 in addition to the formation of source/drain electrodes 13*sd*. The formation of these electrodes and wiring lines are performed in a manner similar to those of the first embodiment and any of technologies and materials can be applied thereto, but are not limited thereto.

Next, as shown in FIG. 14B, a partition wall layer 15 is formed on the substrate 3 on which the transmissive display electrodes 11 and the source/drain electrodes 13*sd* are formed. The partition wall layer 15 includes a first opening 15*a*, a second opening 15*b*, and a third opening 15*c*, each of which has a side wall with a reversely tapered cross-sectional profile. Furthermore, the location of the respective openings 15*a*, 15*b*, and 15*c* formed are similar to those described above with reference to FIG. 12 and FIG. 13. These openings may be formed in a manner similar to those of the first embodiment.

Subsequently, as shown in FIG. 14C, a semiconductor layer 17 is deposited from above the partition wall layer 15. Thus, a channel-region semiconductor layer 17*c* composed of the semiconductor layer 17 is formed on the bottom of the first opening 15*a* so as to be separate from a semiconductor layer 17 disposed on the partition wall layer 15. In addition, a method of forming such a semiconductor layer 17 may be similar to that of the first embodiment.

Subsequently, as shown in FIG. 14D, an insulating film 9 is formed so as to cover the partition wall layer 15 and the semiconductor layers 17. This gate insulating film 9 is formed in a manner similar to that of the first embodiment. Next, the semiconductor layer 17 is exposed at the bottom of the second opening 15*b* of the partition wall layer 15 by pattern-removal of the gate insulating film 9 on the transmissive display electrode 11.

Here, the gate insulating film 9 may be formed so as to be extensively opened on the transmissive display electrode 11 by a printing method or the like in advance.

Next, using etching with the resist pattern used for the pattern removal of the gate electrode film 9 or the gate insulating film 9 itself as a mask, the transmissive display electrode 11 is exposed from the bottom of the second opening 15*b* by removing the semiconductor layer 17 from the transmissive display electrode 11 on the bottom of the second opening 15*b*.

After that, as shown in FIG. 14E, scan lines and common wiring lines are formed on the gate insulating film 9 in addition to the formation of a gate electrode 5g and an upper electrode 7c'. The formation of these electrodes and the wiring lines may be performed using any of technologies and materials.

Consequently, a top-gate/bottom-contact type thin-film transistor Tr' is obtained. Such a transistor Tr' includes the gate electrode 5g on the channel-region semiconductor layer 17c through the gate insulating film 9, where the channel-region semiconductor layer 17c is formed extending over a pair of the source/drain electrodes 13sd. In addition, the capacitative element Cs is obtained. The capacitative element Cs is constructed of the gate insulating film 9 and the semiconductor layer 17 disposed between the source/drain electrode 13sd serving as a lower electrode and the upper electrode 7c' on the bottom of the third opening 15c.

After that, an insulating film 9 is formed above the substrate 3 while covering the gate electrode 5g and the lower electrode 7c. This insulating film 19 is formed in a shape of allowing the transmissive display electrode 11 to be extensively exposed. The formation of such an insulating film 19 may be performed such that the insulating film 19 is deposited over the substrate 3 and the pattern removal of the insulating film 19 on the transmissive display electrode 11 is then performed on the bottom of the second opening 15b of the partition wall layer 15. Alternatively, a printing method or the lime may be employed to make a wide opening on the transmissive display electrode 11 in advance. In addition, the insulating film 19 may be formed as a planarizing film with a flat surface as shown in the figure or may be formed without embedding the stepped portions of the partition wall layer 15. Furthermore, when the insulating film 19 has an irregular surface, it is preferable that the side walls of the openings 15a and 15b has a usual tapered cross-sectional profile instead of a reversely tapered cross-sectional profile. In addition, this insulating film 19 may have a single-layer structure or a laminated structure.

Such an insulating film 19 is made of silicon nitride; silicon oxide; acrylic resin such as polyparaxylene, polyvinyl alcohol, polyvinyl phenol, or PMMA; or the like.

After that, an oriented film 21 is disposed from above the substrate 3 to complete the drive-side substrate 3 (namely, the backplane of the display device).

Subsequently, as shown in FIG. 13, a common electrode 33 made of a transmissive conductive material and an oriented film 35 are formed one by one on an opposing substrate 31 made of a transparent material. Then, the substrate 3 and the opposing substrate 31 are arranged face-to-face with each other while the oriented film 21 and the oriented film 35 face to each other. Furthermore, a spacer (not shown) is disposed between the substrates 3 and 31 and a liquid crystal layer LC is then introduced, completing the transmissive liquid crystal display device 1-8 using a top-gate type thin-film transistor.

According to the eighth embodiment as described above, the channel-region semiconductor layer 17ch is formed on the bottom of the first opening 15a formed in the partition wall layer 15. In addition, the second opening 15b that exposes an area where the transmissive display electrode 11 is formed is formed in the partition wall layer 15. In addition, the semiconductor layer 17 formed on the bottom of the second opening 15b is removed therefrom. Therefore, like the first embodiment, the display device 1-8 can obtain display light without any influence on the partition wall layer 15 and the semiconductor layer 17 remained on the top thereof, while having the fine channel-region semiconductor layer 17ch.

Ninth Embodiment

Figure 15:
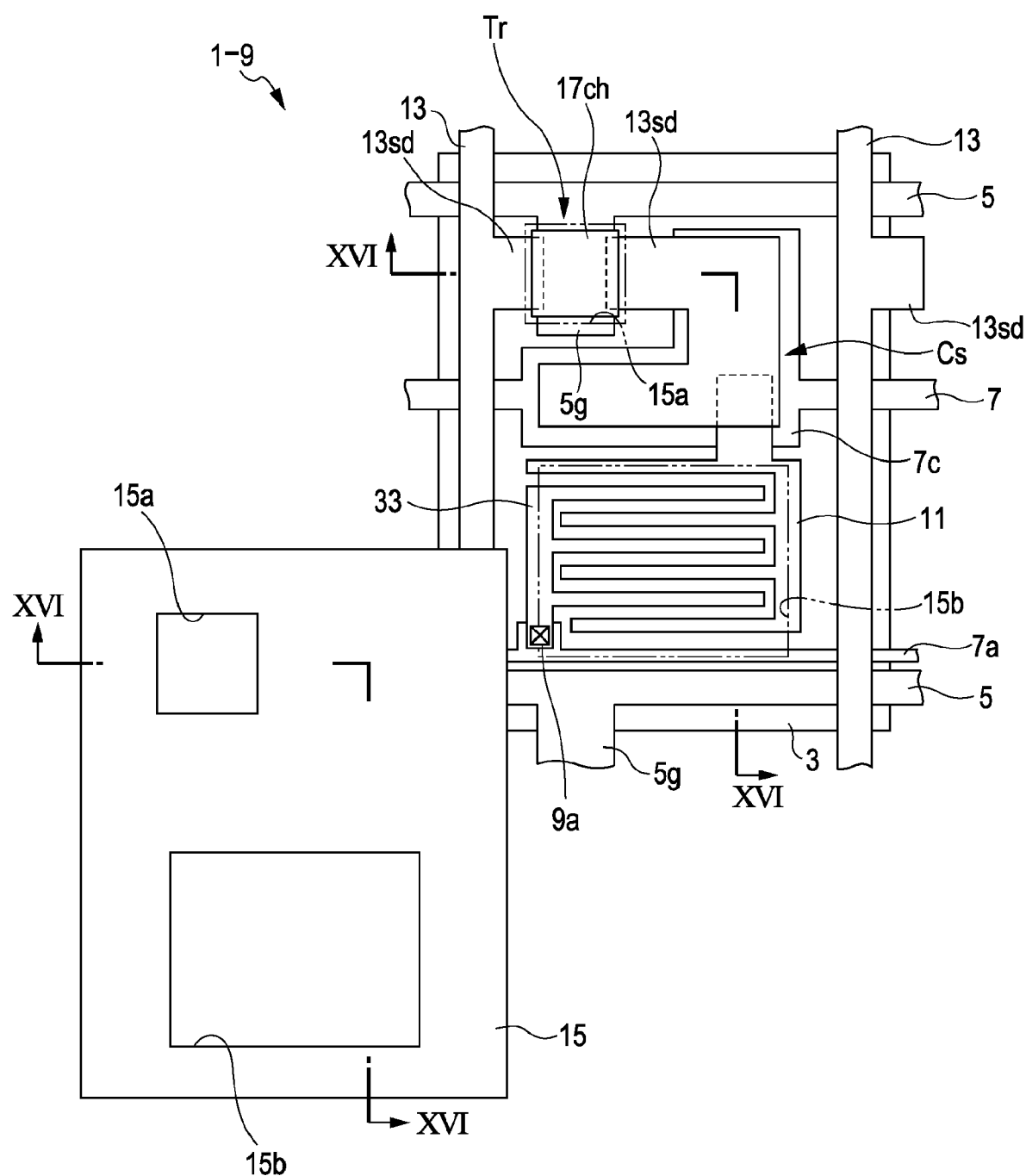
FIG. 15 is a schematic plan view of part of a drive-side substrate, which corresponds to one of pixels, of an IPS-mode display device according to an eighth embodiment of the present invention.
Figure 16:
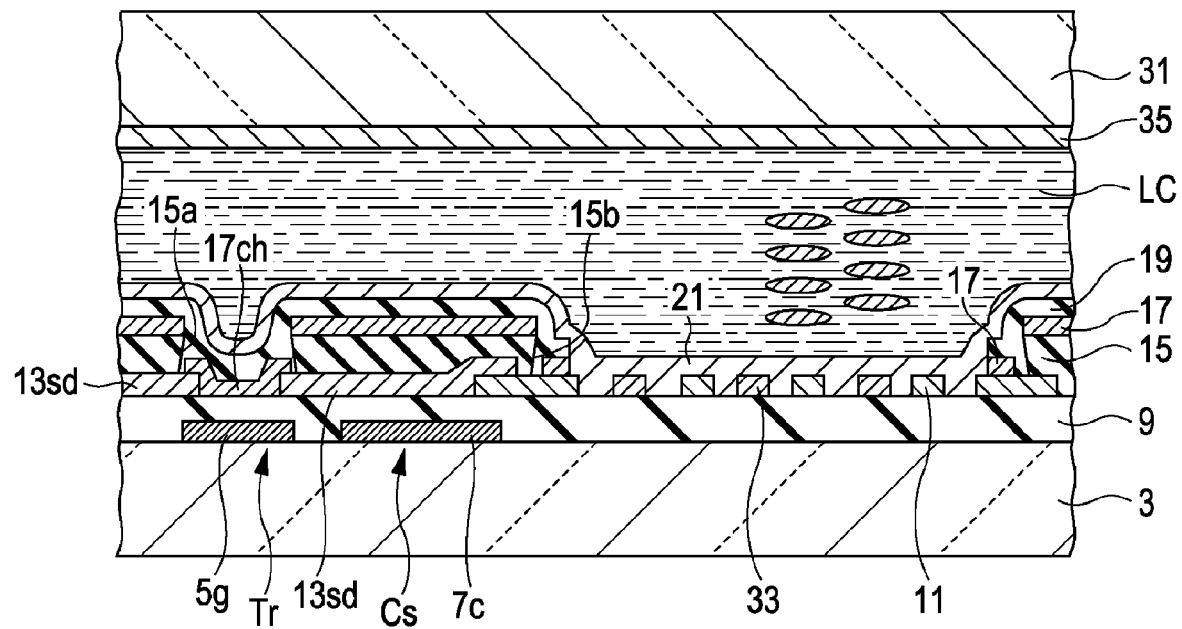
FIG. 16 is a schematic plan view of part of a drive-side substrate, which corresponds to one of pixels, of a display device according to a ninth embodiment of the present invention.

FIG. 15 is a schematic plan view of part of a drive-side substrate, which corresponds to one of pixels, of a display device 1-9 according to a ninth embodiment of the present invention. The display device 1-9 is a liquid crystal display device of an IPS (In-Plane-Switching) mode using a top-gate type thin-film transistor Tr' as a pixel-drive thin-film transistor Tr. In addition, FIG. 16 is a schematic cross-sectional view of a display device 1-9 according to the ninth embodiment of the present invention, corresponding to the section along the line XVI-XVI in FIG. 15. The same components as those in the preceding embodiment are assigned the same reference numerals, and a description of the common structure is omitted.

The display device 1-9 shown in the figures has the same structural components as those of the display device 1-1 of the first embodiment, except that a transmissive display electrode 11 and a common electrode 33 are included in the same layer and any common electrode 33 is not formed on the opposing substrate 31.

In addition, a common wiring line 7a connected to the common electrode 33 may be formed on the substrate 3, apart from a common wiring line 7 serving as a lower electrode 7c of a capacitative element Cs. In this case, for example, the common wiring line 7a is included in the same layer with the gate electrode 5 and the common wiring line 7 serving as a lower electrode 7c of the capacitative element Cs.

In other words, on a gate insulating film 9 that covers the gate electrode 5g and the lower electrode 7c of the capacitative element according to the ninth embodiment of the present invention, both the transmissive display electrodes 11 and the common electrodes 33 are wired alternately in parallel arrangement, so-called comb-like arrangement. Furthermore, the common electrode 33 is connected to the common wring line 7a formed in the same layer as that of the gate electrode 5 and the common wiring line 7 serving as a lower electrode 7c of the capacitative element Cs through a connection hole 9a (only shown in FIG. 15) formed in the gate insulating film 9.

Furthermore, a second opening 15b formed in the partition wall layer 15 is shaped so that it can be extensively opened on both the transmissive display electrodes 11 and the common electrodes 33.

In the display device constructed as described above, when the orientation of the liquid crystal layer LC changes into a predetermined state in a lateral electric field applied between the transmissive display electrode 11 and the common electrode 33, light incident from the substrate 3 though a deflection plate and passed through the liquid crystal layer LC can be taken out as display light after passing through a deflection plate on the opposing substrate 31.

In a method of manufacturing such a display device 1-9 constructed as described above, the same procedures as those of the first embodiment illustrated in FIG. 3 are performed, except for an additional step of forming a connection hole 9a in the gate insulating film before the formation of the transmissive display electrode 11. The connection hole 9 is formed to reach the common wiring line 7 in the gate insulating film 9. In addition, the patterning of the common electrode 33 may be performed by the same step as that of the patterning of the transmissive display electrode 11.

The IPS-mode display device 1-9 constructed as described above includes the channel-region semiconductor layer 17ch on the bottom of the first opening 15a formed in the partition wall layer 15. In addition, the second opening 15b that exposes an area, where the transmissive display electrode 11 is formed, is formed in the partition wall layer 15. In addition, the semiconductor layer 17 formed on the bottom of the second opening 15b is removed therefrom. Therefore, like the first embodiment, the display device can obtain display light without any influence on the semiconductor layer 17, while having the fine channel-region semiconductor layer 17ch.

Furthermore, the configuration of the display device of the ninth embodiment may be provided as a semitransmissive/semireflective one by being combined with that of the fifth or sixth embodiment. Furthermore, the configuration of the display device 109 of the ninth embodiment may be provided with a top-gate type thin-film transistor by being combined with that of the eighth embodiment.

Furthermore, the display device 109 of the ninth embodiment may be constructed as a liquid crystal display device of a FFS (Field Fringe Switching) mode by providing a common electrode 33 under the gate insulating film 8 located on the layer lower than the comb-shaped transmissive display electrode 11. In this case, the common electrode 33 may be formed on the whole surface corresponding to the second opening 15b. Such a configuration of the display device can also obtain similar effects.

Furthermore, the display device of the first to ninth embodiments may be provided with the transmissive display electrode 11 as a reflective pixel electrode. Even in this case, the barrier layer 15 and the semiconductor layer 17 on the reflective pixel electrode can be removed therefrom. thus, light incident from the opposing substrate 31 can be reflected on the reflective pixel electrode and taken out as display light without any influence of the barrier layer 15 and the semiconductor layer 17.

The present application contains subject matter related to that disclosed in Japanese Priority Patent Application JP 2008-157489 filed in the Japan Patent Office on Jun. 7, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A display device, comprising:
a source electrode and a drain electrode of a thin-film transistor formed on a substrate;
a pixel electrode formed on said substrate and in contact with said source electrode or said drain electrode;
an insulating partition wall layer formed on said substrate and having (a) a first opening extending between said source electrode and said drain electrode and (b) a second opening formed on said pixel electrode and extending to said pixel electrode;
a channel-region semiconductor layer formed on the bottom of said first opening;
an insulating film formed on said insulating partition wall layer so as to cover said first opening and said channel-region semiconductor layer; and
an oriented film covering said first opening from the top of said insulating film and covering said second opening from the top of said pixel electrode.

2. The display device according to claim 1, further comprising a semiconductor layer made of the same material as that of said channel-region semiconductor layer and that is formed on the upper part of said insulating partition wall layer.

3. The display device according to claim 1, wherein said channel-region semiconductor layer is made of an organic material.

4. The display device according to claim 1, further comprising:
an opposing substrate facing said substrates; and
a liquid crystal layer disposed between said substrate and said opposing substrate.

5. The display device according to claim 1, further comprising:
a gate electrode of the thin-film transistor and a gate insulating film formed between said substrate and said channel-region semiconductor layer,
wherein,
said thin-film transistor is a bottom-gate type transistor.

6. The display device according to claim 1, wherein:
said pixel electrode is a transmissive display electrode; and
a reflective pixel electrode is electrically connected to said transmissive display electrode on the upper layer of said insulating partition wall layer through said insulating film.

7. The display device according to claim 6, further comprising:
a third opening formed in said insulating partition wall layer and extending to said source electrode or said drain electrode; and
a connection hole extending to said source electrode or said drain electrode in the inner side of said third opening and that is formed in at least said insulating film,
wherein,
said reflective pixel electrode is connected to said transmissive display electrode through said source electrode or said drain electrode exposed at the bottom of said connection hole.

8. The display device according to claim 6, further comprising:
a third opening extending to said source electrode or said drain electrode and that is formed in said insulating partition wall layer; and
a semiconductor layer placed on the bottom of said third opening and made of the same material as that of said channel-region semiconductor layer,
wherein,
a connection hole is formed in said insulating film and said semiconductor layer placed on the bottom of said third opening;
said connection hole extends to said source electrode or said drain electrode in the inside of said third opening, while being insulated from said semiconductor layer on said insulating partition wall layer; and
said reflective pixel electrode is connected to said transmissive display electrode through said source electrode or said drain electrode exposed at the bottom of said connection hole.

9. The display device according to claim 6, wherein a height of the position of said reflective pixel electrode with respect to a height of the position of said transmissive display electrode is adjusted with reference to a height of said insulating partition wall layer.

10. The display device according to claim 1, further comprising a gate electrode of the thin-film transistor formed on said channel-region semiconductor layer through a gate insulating film,
wherein,
said thin-film transistor is a top-gate type transistor.

11. The display device according to claim 1, wherein said pixel electrode is a conductive pattern.

* * * * *